(12) United States Patent
Tanaka et al.

(10) Patent No.: US 7,524,712 B2
(45) Date of Patent: Apr. 28, 2009

(54) METHOD FOR MANUFACTURING A SEMICONDUCTOR DEVICE AND LASER IRRADIATION METHOD AND LASER IRRADIATION APPARATUS

(75) Inventors: Koichiro Tanaka, Atsugi (JP); Hirotada Oishi, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 944 days.

(21) Appl. No.: 10/792,797

(22) Filed: Mar. 5, 2004

(65) Prior Publication Data

US 2007/0184590 A1    Aug. 9, 2007

(30) Foreign Application Priority Data

Mar. 7, 2003    (JP) ............................. 2003-061133

(51) Int. Cl.
*H01L 21/8238* (2006.01)

(52) U.S. Cl. ..................... 438/166; 438/198; 438/486

(58) Field of Classification Search ............... 438/150, 438/166, 198, 486, 487
See application file for complete search history.

(56) References Cited

U.S. PATENT DOCUMENTS

| 5,643,801 | A | 7/1997 | Ishihara et al. |
|---|---|---|---|
| 5,643,826 | A | 7/1997 | Ohtani et al. |
| 5,897,799 | A | 4/1999 | Yamazaki et al. |
| 5,900,980 | A | 5/1999 | Yamazaki et al. |
| 5,923,962 | A | 7/1999 | Ohtani et al. |
| 5,953,597 | A | 9/1999 | Kusumoto et al. |
| 5,959,779 | A | 9/1999 | Yamazaki et al. |
| 6,002,523 | A | 12/1999 | Tanaka |
| 6,038,075 | A | 3/2000 | Yamazaki et al. |
| 6,285,042 | B1 | 9/2001 | Ohtani et al. |
| 6,544,825 | B1 | 4/2003 | Yamazaki |
| 6,548,370 | B1 | 4/2003 | Kasahara et al. |
| 2004/0069751 | A1* | 4/2004 | Yamazaki et al. ........ 219/121.6 |

FOREIGN PATENT DOCUMENTS

| JP | 04-124813 | 4/1992 |
|---|---|---|
| JP | 07-183540 | 7/1995 |
| JP | 07-187890 | 7/1995 |
| JP | 2003-45820 | 2/2003 |

* cited by examiner

*Primary Examiner*—Kevin M Picardat
(74) *Attorney, Agent, or Firm*—Eric J. Robinson; Robinson Intellectual Property Law Office, P.C.

(57) ABSTRACT

When the CW laser is employed for annealing the semiconductor film, a device having a high characteristic can be expected. On the other hand, when the beam shaped to be elliptical is scanned on the semiconductor film, a proportion of excimer-like crystal grain region becomes large and this is a problem in point of high integration. The present invention is to make the excimer-like crystal grain region formed over the semiconductor film as small as possible.

In the present invention, a fundamental wave having a wavelength of approximately 1 μm is irradiated supplementarily to the semiconductor film, which is the irradiated surface, simultaneously with a harmonic emitted from a CW laser. In addition, the fundamental wave is irradiated with a large amount of energy to a region irradiated by the harmonic with a small amount of energy, and the fundamental wave is irradiated with a small amount of energy to a region irradiated by the harmonic with a large amount of energy. Thus it becomes possible to form the long crystal grain region in the semiconductor film while suppressing the formation of the excimer-like crystal grain region.

10 Claims, 12 Drawing Sheets

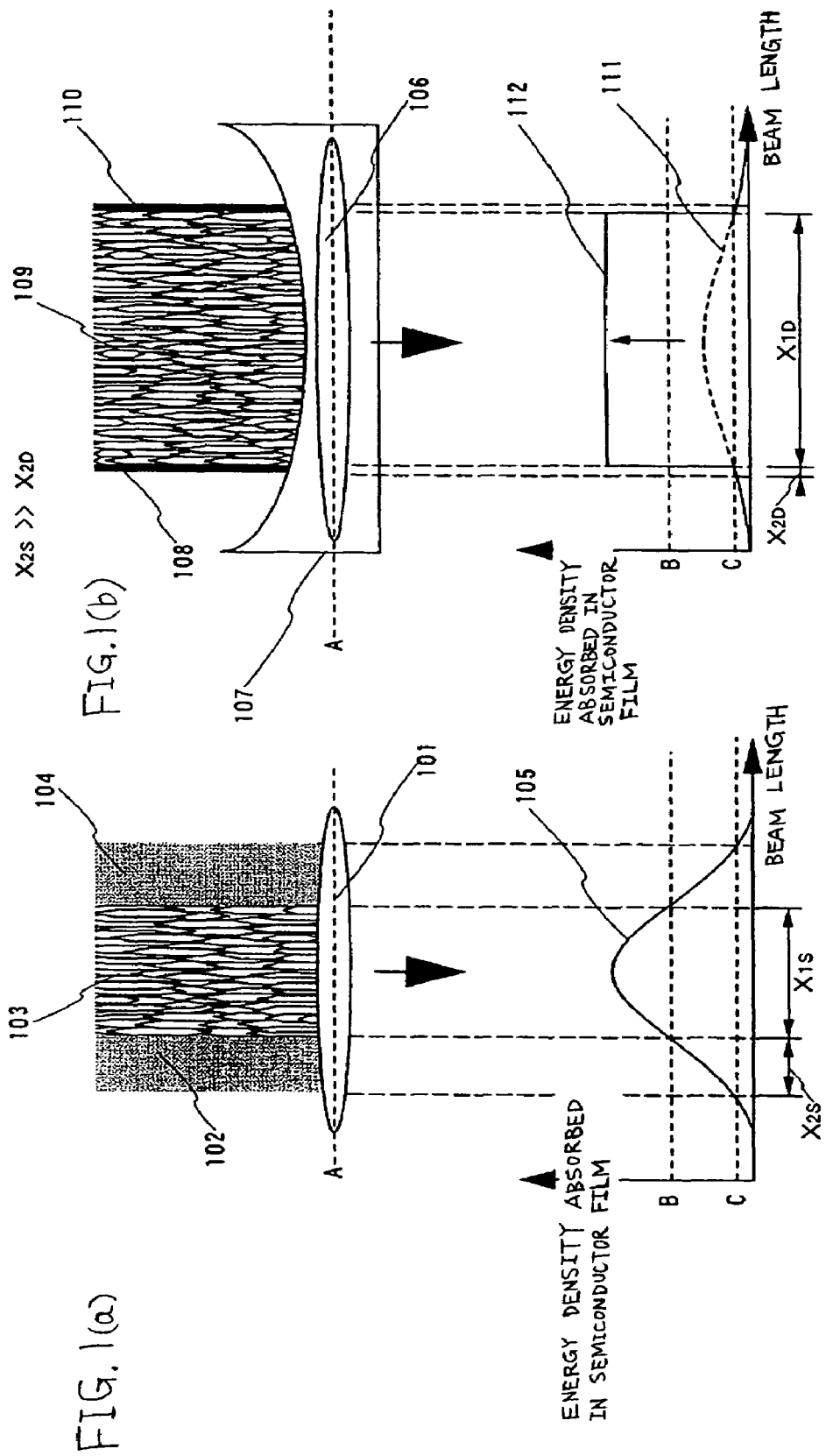

PLAN VIEW OF BEAM SPOT

↑ SCANNING DIRECTION

↑ SCANNING DIRECTION

↑ SCANNING DIRECTION

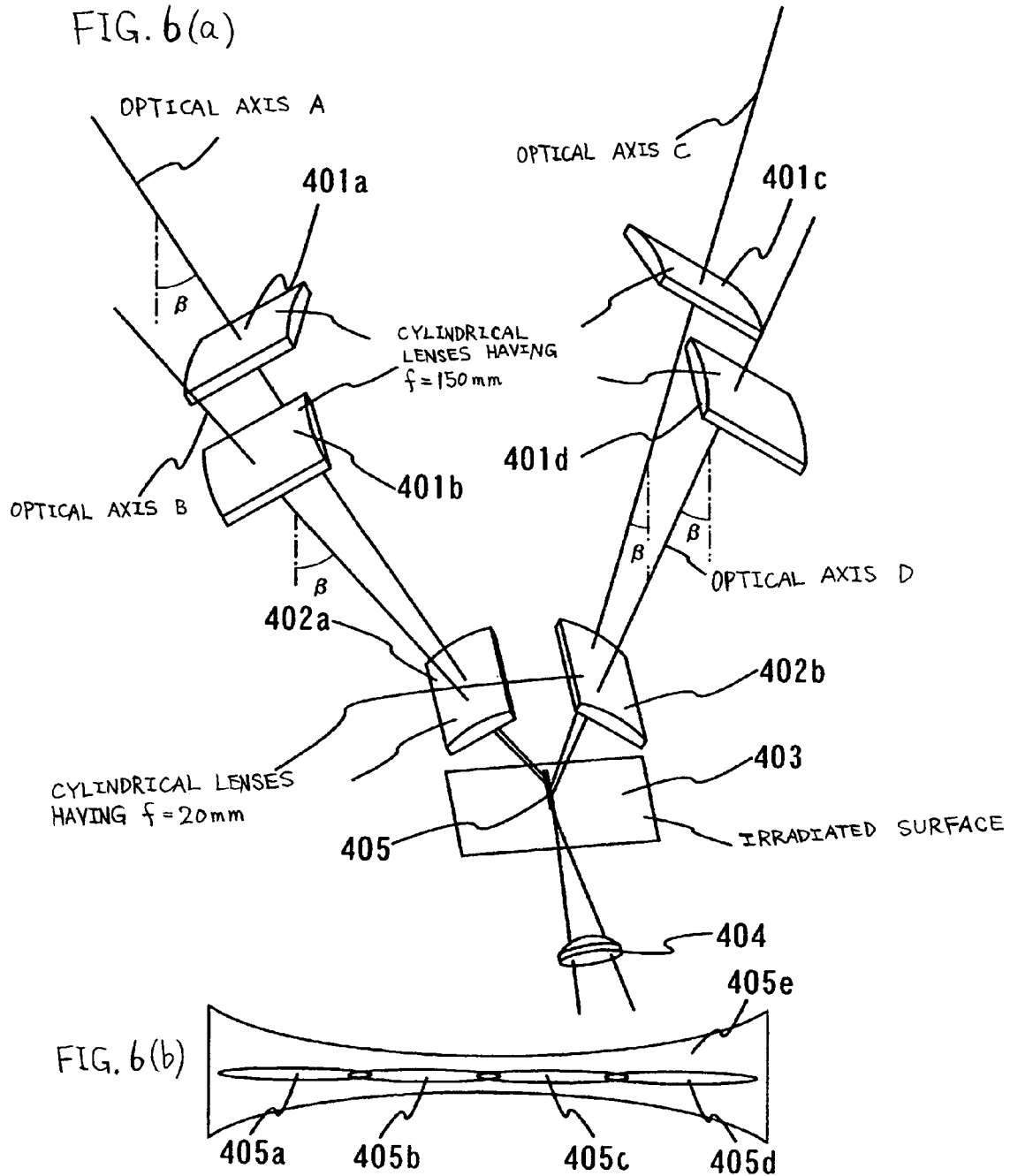

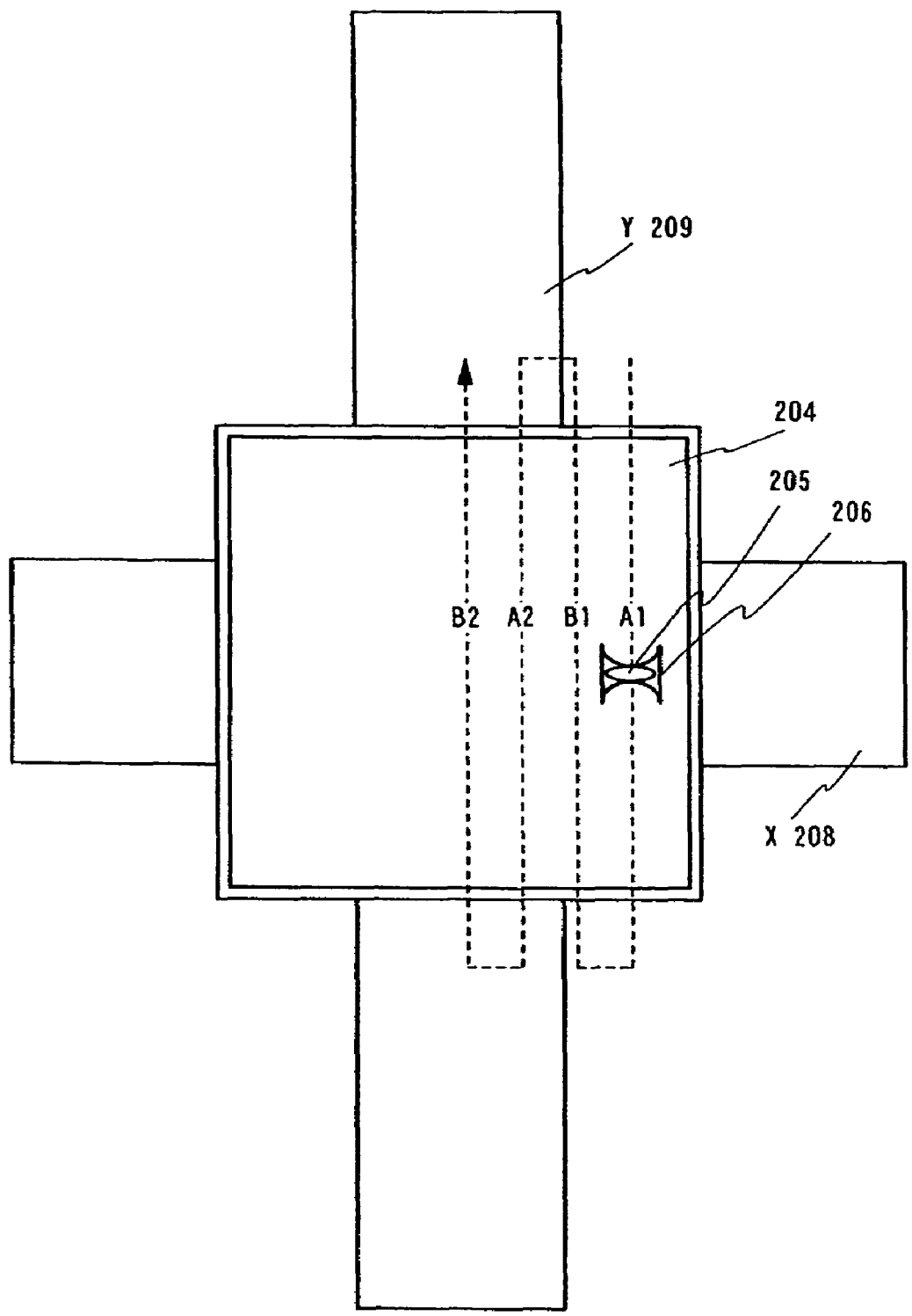

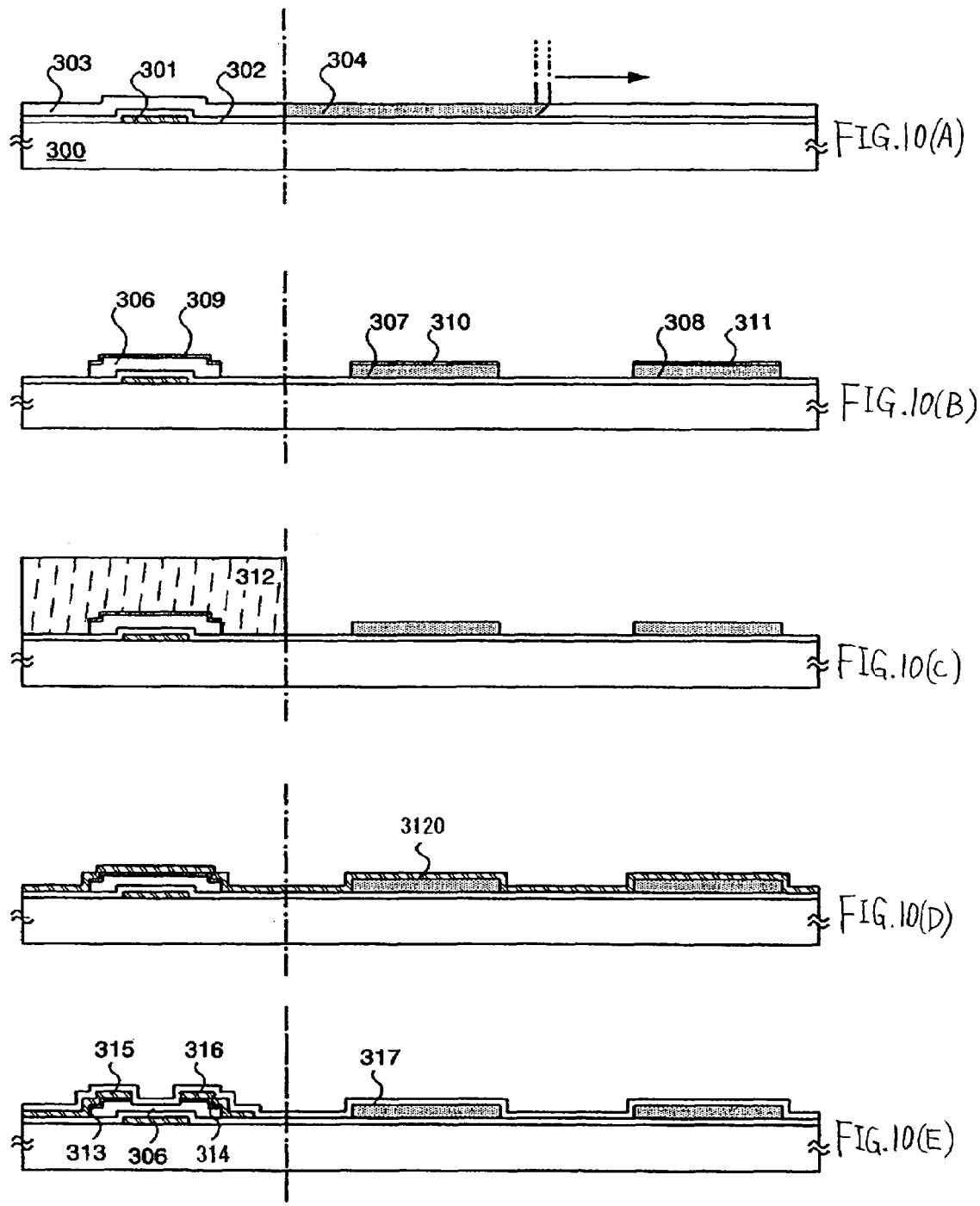

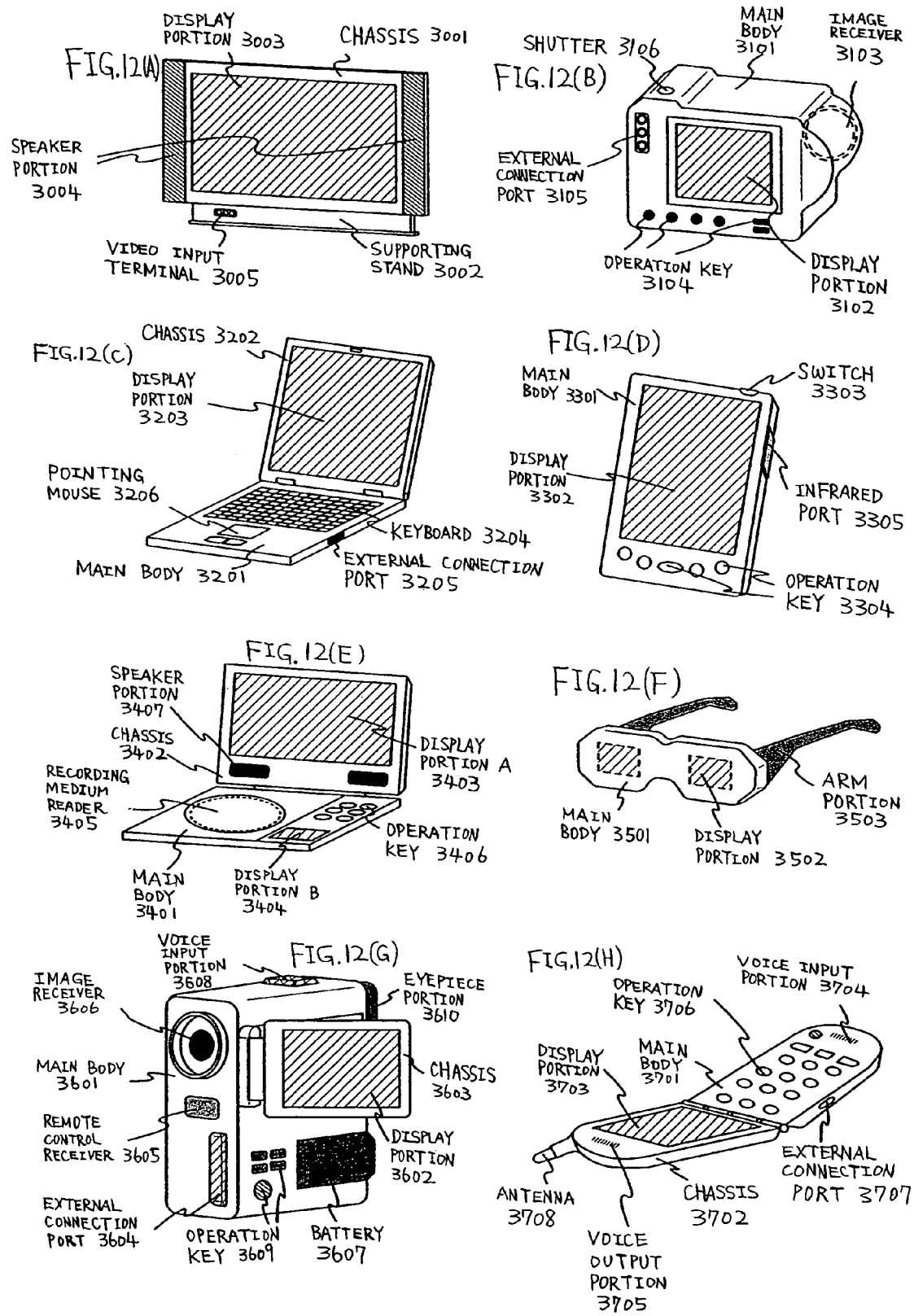

METHOD FOR MANUFACTURING A SEMICONDUCTOR DEVICE AND LASER IRRADIATION METHOD AND LASER IRRADIATION APPARATUS

FIELD OF THE INVENTION

The present invention relates to a laser irradiation method and to a laser irradiation apparatus (the apparatus includes a laser and an optical system to lead laser light output from the laser to an irradiated body) to perform the laser irradiation. In addition, the present invention also relates to a method for manufacturing a semiconductor device including a step of the laser processing. It is noted that the semiconductor device described herein indicates a general apparatus that can be functioned by utilizing a semiconductor characteristic including an electro-optical device such as a liquid crystal display device and a light-emitting apparatus, and an electronic device having the electro-optical device as its component.

BACKGROUND ART

In recent years, the technology to manufacture a thin film transistor (hereinafter referred to as TFT) over a substrate makes great progress and application development to an active matrix display device has been advanced. In particular, TFT using a poly-crystal semiconductor film is superior in field-effect mobility (also referred to as mobility) to TFT using a conventional amorphous semiconductor film and thereby high-speed operation becomes possible. Therefore, it has been tried to control a pixel by a driver circuit formed over the same substrate as the pixel, which was controlled conventionally by a driver circuit provided outside the substrate.

By the way, a substrate used for the semiconductor device is expected to be a glass substrate rather than a single-crystal silicon substrate in terms of its cost. The glass substrate, however, is inferior in heat resistance and easy to change in shape due to the heat. Therefore, when a poly-silicon TFT is formed over the glass substrate, laser annealing is performed to crystallize the semiconductor film in order to prevent the glass substrate from changing in shape due to the heat.

The characteristic of the laser annealing is that the processing time can be drastically shortened compared with another annealing method by radiation heating or conductive heating and that a semiconductor substrate or a semiconductor film can be heated selectively and locally so that the substrate is hardly damaged thermally.

It is noted that the laser annealing method described herein includes the technique to recrystallize a damaged layer or an amorphous layer formed in the semiconductor substrate or the semiconductor film, and the technique to crystallize an amorphous semiconductor film formed over the substrate. In addition, the technique to planarize or modify the surface of the semiconductor substrate or the semiconductor film is also included.

The lasers used for the laser annealing are classified broadly into two types, a pulsed laser and a continuous wave (CW) laser according to its oscillation system. In recent years, it has been understood that in crystallization of the semiconductor film, a crystal grain formed over the semiconductor film becomes larger when using the CW laser than that when using the pulsed laser. When the crystal grain formed over the semiconductor film becomes larger, the number of the grain boundaries included in the channel region in TFT formed using this semiconductor film decreases and thereby the mobility becomes higher. As a result, such a semiconductor film can be applied to develop a device having higher-performance. For this reason, the CW laser oscillator is beginning to attract attention.

In addition, in order to enhance the productivity in the process of the laser annealing of the semiconductor or the semiconductor film by means of the CW laser, the method is often employed in which a laser beam emitted from the laser oscillator is shaped into long elliptical on the irradiated surface, and the elliptical laser beam (hereinafter referred to as the elliptical beam) is irradiated to the semiconductor film. The reason why the laser beam becomes elliptical is that the original shape of the laser beam is circular or near-circular. (For example, refer to patent document 1)

[patent document 1] Japanese Patent Unexamined Publication No. 2003-045820

DISCLOSURE OF THE INVENTION

Problems to be Solved by the Invention

When the CW laser is used to anneal the semiconductor film, it can be expected to manufacture a device having a considerably high characteristic. On the other hand, the beam spot formed with the laser having a wavelength band absorbed sufficiently in the semiconductor film has an extremely small size. For example, in the case of employing a YAG laser, since a laser beam have to be converted into a harmonic, only the laser having the maximum output as low as approximately 10 W is employed and the beam spot has a size of approximately 500 µm×20 µm at a maximum on the irradiated surface. Therefore, the laser annealing is performed to the necessary part on the irradiated surface in such a way that the beam spot having such a size is moved on the irradiated surface from front to back and from side to side.

Here, an irradiation track of an elliptical beam spot 101 on a semiconductor film is shown in FIG. 1(a). In addition, energy density distribution of the beam spot 101 in cross section A is shown with a reference numeral 105. In the irradiation track of the beam spot on the semiconductor film, there are formed states of crystals that can be broadly classified into two types. In regions 102 and 104, there are formed crystal grains similar to crystal crystallized with a pulsed excimer laser. In a region 103, there is formed a state of crystal whose grain size is much larger than that crystallized with the pulsed excimer laser (hereinafter, this state is referred to as a long crystal grain).

More specifically, the long crystal grain formed in the region 103 has a length of several µm in the minor axis and a length ranging from several tens to several hundreds µm in the major axis extending long in a scanning direction of the laser. An infinite number of the long crystal grains are formed in the region 103 in a paved state. On the other hand, the crystal grain formed in the regions 102 and 104 have a length of not more than several µm in the major axis or have a diameter of approximately 1 µm, which is much smaller than the long crystal grain. The regions 102 and 104 are formed as an aggregation of such small crystal grains. The small crystal grains formed in the regions 102 and 104 can be assumed as the crystal grains similar to those crystallized with the pulsed excimer laser. Hereinafter, the region in which the crystal grain similar to that crystallized with the pulsed excimer laser is formed is referred to as an inferior crystalline region.

When the crystal grain in the semiconductor film becomes larger, the number of grain boundaries in the channel region of TFT formed using the semiconductor film decreases so that the mobility becomes higher. In addition, the mobility of TFT formed in the inferior crystalline region is much lower than that of TFT formed in the long crystal grain region. In other words, there is a big difference between the electric characteristic of TFT formed in the long crystal grain region and that of TFT formed in the inferior crystalline region. Therefore, when a semiconductor device such as a CPU requiring a high characteristic is manufactured, the semiconductor element cannot be formed in the inferior crystalline region.

When the semiconductor film is irradiated with the elliptical beam having Gaussian energy density distribution, a proportion of the inferior crystalline region is usually about 20% in the irradiation track. Thus, since TFT cannot be arranged in 20% of the semiconductor film, there is a problem in terms of high integration of the semiconductor element. It is an object of the present invention to make the inferior crystalline region formed on the semiconductor film as small as possible.

Means to Solve the Problems

In the present invention, the fundamental wave having a wavelength of approximately 1 μm is irradiated supplementarily to the semiconductor film, which is the irradiated surface, simultaneously with the harmonic emitted from the CW laser. In addition, the fundamental wave is irradiated with a comparatively large amount of energy to the region of the semiconductor film where the harmonic is irradiated with a comparatively small amount of energy. The fundamental wave is irradiated with a comparatively small amount of energy to the region of the semiconductor film where the harmonic is irradiated with a comparatively large amount of energy. The present invention provides a laser irradiation method, a laser irradiation apparatus, and a method for manufacturing a semiconductor device, that make it possible to form the long crystal grain region on the semiconductor film while preventing the formation of the inferior crystalline region by means of the method described above.

FIG. 1(b) is a drawing to explain the content of the present invention. A semiconductor film is irradiated with an elliptical beam spot 106. The beam spot 106 has a wavelength band in the region absorbed sufficiently in the semiconductor film and the energy density distribution of the beam spot 106 in cross section A is shown with a reference numeral 111. In the figure, energy density B is a threshold value at which the long crystal grain region is formed, and energy density C is a threshold value at which the semiconductor film melts.

In the present invention, the beam spot 107 having the fundamental wave is irradiated supplementarily so as to overlap with the beam spot 106. Although the fundamental wave having a wavelength of approximately 1 μm is not absorbed in the normal semiconductor film, it is absorbed sufficiently in the semiconductor film melted by the harmonic. Therefore, the fundamental wave is absorbed only in the region where the beam spot 106 is irradiated and where the energy density exceeds the threshold value C at which the semiconductor film melts. In other words, the energy distribution absorbed in the semiconductor film can be made discontinuous as shown with a continuous line in FIG. 1(b). Therefore, it is also possible to give the semiconductor film only the energy for forming the long crystal grain region without giving it the energy for forming the inferior crystalline region (the energy between the threshold values B and C in FIG. 1(b)) at all.

The energy density distribution absorbed in the semiconductor film when it is irradiated with the beam spots 106 and 107 is shown with a continuous line 112. It is noted that although the absorption coefficient of the fundamental wave is $5 \times 10^2$/cm or less, the absorption coefficient not less than $5 \times 10^3$/cm is necessary in order to process the normal semiconductor film by giving the energy. Therefore, when the absorption coefficient of the fundamental wave changes at least 10 times by melting the semiconductor film, advantageous effect expected by the present invention can be obtained in the process with the present invention applied.

In the irradiation track formed by the beam spots 106 and 107 on the semiconductor film, there are formed states of crystals that can be broadly classified into two types. Regions 108 and 110 are the inferior crystalline regions, and a region 109 is the long crystal grain region. The widths of the regions 108 and 109 are expressed with $X_{2D}$ and $X_{1D}$ respectively. The proportion of the inferior crystalline region is much smaller and that of the long crystal grain region is larger in the irradiation track shown in FIG. 1(b) than those in the irradiation track formed by irradiating only the elliptical beam spot as shown in FIG. 1(a).

In the irradiation track of FIG. 1(a), a region 102 is the inferior crystalline region and a region 103 is the long crystal grain region. The widths of the regions 102 and 103 are expressed with $X_{2S}$ and $X_{1S}$ respectively, and they are in the relation of inequalities of $X_{2S} >> X_{2D}$ and $X_{1D} > X_{1S}$. In addition, in FIG. 1(b), the beams are scanned in such a way that the harmonic is overlapped with the fundamental wave having the shape in which the width thereof in opposite ends in the longitudinal direction of the beam spot of the harmonic is broad and the width thereof in the center is narrow. The beam spot having the width that is broader in the opposite ends than in the center in the scanning direction is employed as the beam spot 107 of the fundamental wave. When the beam spot 107 is scanned on the semiconductor film, it is possible to keep giving the irradiation energy by the fundamental wave longer to the region irradiated with the end portion of the beam spot of the harmonic than to the region irradiated with the center portion thereof. This makes it possible to homogenize the energy distribution of the laser given to the semiconductor film in the direction of the width of the long crystal grain region. This has an advantageous effect that the electric characteristic of the semiconductor film can be uniformed. The beam spot 107 is shaped by a light-blocking film such as a metal film arranged above the semiconductor film. It is desirable to make the distance between the light-blocking film and the surface of the semiconductor film as short as possible in order to prevent the effect of diffraction light. In addition, the beam spot of the fundamental wave may be shaped not only by the above method but also by the other method. A diffractive optical element or the like may be employed in the structure to irradiate the semiconductor film with the desired beam spot.

As above, in the present invention, the shape of the beam spot of the fundamental wave or the energy distribution thereof is changed to irradiate the semiconductor film so that the fundamental wave is irradiated with a comparatively large amount of energy to the region irradiated by the harmonic with a comparatively small amount of energy.

The above method makes it possible to form a long crystal grain region having more uniform electrical characteristic in the semiconductor film while suppressing the formation of the inferior crystalline region. It is noted that the shape of the beam spot used to irradiate the semiconductor film is not limited to that shown in FIG. 1(b) in the present invention. The beam emitted from the laser of the fundamental wave may be processed so as to have a shape shown in FIGS. 2(a), (b), or (c) and the beam spot having such a shape may be also used. In addition, a plurality of the beams of the harmonics may be chained to form a long beam and the beam spot of the fundamental wave may be overlapped with the long beam. Alternatively, a plurality of the beams of the fundamental waves may be used. Moreover, a plurality of fundamental waves and a plurality of the harmonics may be also used. In addition, after the energy density of the beam spot of the fundamental wave is changed into a shape shown in FIG. 3(a) or (b), the fundamental wave may be irradiated with a comparatively large amount of energy to the region irradiated by the harmonic with a comparatively small amount of energy. Alternatively, even though the fundamental wave is shaped so as to have the uniform energy density distribution as shown in FIG. 3(c), an advantageous effect of the present invention can be obtained.

The present invention provides a method for manufacturing a semiconductor device comprising the steps of forming a non-single crystal semiconductor film over a substrate, irradiating a first beam having a wavelength range in which an absorption coefficient to the non-single crystal semiconductor film is $5 \times 10^3$/cm or more simultaneously with a second beam having a wavelength range in which an absorption coefficient to the non-single crystal semiconductor film is $5 \times 10^2$/cm or less and an absorption coefficient to a melted state of the non-single crystal semiconductor film is $5 \times 10^3$/cm or more in such a way that the first beam and the second beam are overlapped on the irradiated surface, and moving the irradiated surface to a first direction relative to the first beam and the second beam.

The present invention also provides a method for manufacturing a semiconductor device comprising the steps of forming a non-single crystal semiconductor film over a substrate, irradiating a first beam melting the non-single crystal semiconductor film simultaneously with a second beam in which an absorption coefficient $\alpha$ to a melted state of the non-single crystal semiconductor film and an absorption coefficient $\beta$ to a solid state of the non-single crystal semiconductor film satisfy an inequality of $\alpha > 10\beta$ in such a way that the first beam and the second beam are overlapped on the irradiated surface, and moving the irradiated surface to a first direction relative to the first beam and the second beam.

The present invention provides a method for manufacturing a semiconductor device comprising the steps of forming a non-single crystal semiconductor film over a substrate, processing a first beam emitted from a laser oscillator 1 outputting a wavelength not longer than that of visible light into a long beam on an irradiated surface assuming that the non-single crystal semiconductor film is the irradiated surface, irradiating a second beam emitted from a laser oscillator 2 outputting a fundamental wave with energy distribution thereof homogenized in a region irradiated with the first beam on the irradiated surface so as to overlap with the first beam, forming a long crystal grain region and an inferior crystalline region in opposite ends of the long crystal grain region in the non-single crystal semiconductor film while moving the irradiated surface to a first direction relative to the first beam and the second beam, and moving the irradiated surface to a second direction relative to the first beam and the second beam.

The present invention also provides a method for manufacturing a semiconductor device comprising the steps of forming a non-single crystal semiconductor film over a substrate, processing a first beam emitted from a laser oscillator 1 outputting a wavelength not longer than that of visible light into a long beam on an irradiated surface assuming that the non-single crystal semiconductor film is the irradiated surface, irradiating a second beam emitted from a laser oscillator 2 outputting a fundamental wave so as to overlap with the first beam on the irradiated surface in such a way that energy of the second beam is decreased in a region where energy of the first beam is high and that the energy of the second beam is increased in a region where the energy of the first beam is low, forming a long crystal grain region and an inferior crystalline region in opposite ends of the long crystal grain region in the non-single crystal semiconductor film while moving the irradiated surface to a first direction relative to the first beam and the second beam, and moving the irradiated surface to a second direction relative to the first beam and the second beam.

The present invention also provides a method for manufacturing a semiconductor device comprising the steps of forming a non-single crystal semiconductor film over a substrate, processing a first beam emitted from a laser oscillator 1 outputting a wavelength not longer than that of visible light into a long beam on an irradiated surface assuming that the non-single crystal semiconductor film is the irradiated surface, irradiating a second beam emitted from a laser oscillator 2 outputting a fundamental wave so as to overlap with the first beam on the irradiated surface in such a way that a width of the second beam is narrowed in a region where energy of the first beam is high and that the width of the second beam is broadened in a region where the energy of the first beam is low, forming a long crystal grain region and a region in which a crystal grain similar to a crystal formed in opposite ends of the long crystal grain region in the non-single crystal semiconductor film while moving the irradiated surface to a first direction relative to the first beam and the second beam, and moving the irradiated surface to a second direction relative to the first beam and the second beam.

In the above constitution of the present invention, when the width of the long crystal grain region is assumed to be $X_1$ and the width of the inferior crystalline region is assumed to be $X_2$, $X_1$ and $X_2$ satisfy an inequality of $X_2/(2X_2+X_1)<0.1$. It is noted that the crystal grain usually has a diameter of 1 μm or less in the inferior crystalline region.

In the above constitution of the present invention, the first beam or the second beam is emitted from a CW gas laser, a CW solid laser, or a CW metal laser. As the gas laser, an Ar laser, a Kr laser, a $CO_2$ laser, and the like are given. As the solid laser, a YAG laser, a $YVO_4$ laser, a YLF laser, a $YAlO_3$ laser, a $Y_2O_3$ laser, a ruby laser, an alexandrite laser, a Ti:sapphire laser, and the like are given. As the metal laser, a helium cadmium laser, a copper vapor laser, and a gold vapor laser are given.

In the above constitution of the present invention, the first beam is converted into a harmonic by a nonlinear optical element. As a crystal used for the nonlinear optical element, crystals such as LBO, BBO, KDP, KTP, KB5, and CLBO are superior in terms of conversion efficiency. With the nonlinear optical element put in a resonator of the laser oscillator, it is possible to increase conversion efficiency considerably.

In the above constitution of the present invention, it is preferable that the laser beams are emitted with an oscillation mode of $TEM_{00}$ (single transverse mode) because it becomes possible to improve energy uniformity of the obtained long beam.

When the annealing is performed to the semiconductor film formed over a substrate transparent to the laser beam, in order to realize uniform irradiation of the laser beam, it is desirable that an incidence angle $\phi$ of the laser beam satisfies an inequality of $\phi \geq \arctan(W/2d)$. In the inequality, it is defined that an incidence plane is perpendicular to the irradiated surface and is including a longer side or a shorter side of the laser beam assuming that a shape of the laser beam is rectangular. Moreover, in the inequality, "W" is the length of the longer side or the shorter side included in the incidence plane and "d" is the thickness of the substrate transparent to the laser beam, which is placed at the irradiated surface. In the case of using a plurality of laser beams, the inequality needs to be satisfied with respect to each of the plurality of laser beams. It is defined that a track of the laser beam projected to the incidence plane has an incidence angle $\phi$ when the track is not on the incidence plane. When the laser beam is made incident at an angle $\phi$, it is possible to perform uniform irradiation of the laser beam without interference of reflected light from a surface of the substrate with reflected light from a rear surface of the substrate. The theory above is considered assuming that a refractive index of the substrate is 1. In fact, the substrate has a refractive index of approximately 1.5, and a larger value than the angle calculated in accordance with the above theory is obtained when the value around 1.5 is taken into account. However, since the laser beam on the irradiated surface has energy attenuated at opposite sides in the longitudinal direction thereof, the interference has a small influence on opposite sides and the value calculated in accordance with the inequality is enough to obtain the effect of attenuating the interference.

In addition, as the substrate, a glass substrate, a quartz substrate, a silicon substrate, a plastic substrate, a metal substrate, a stainless substrate, a flexible substrate, and the like can be used. The inequality with respect to $\phi$ is inapplicable to a substrate not transparent to the laser beam because the thickness of the substrate "d" becomes a meaningless value at all in this case.

The present invention provides a laser irradiation apparatus comprising a laser oscillator 1 outputting a wavelength not longer than that of visible light, means for processing a first beam emitted from the laser oscillator 1 into a long beam on an irradiated surface, a laser oscillator 2 outputting a fundamental wave, means for irradiating a second beam emitted from the laser oscillator 2 with energy distribution thereof homogenized in a region irradiated with the long beam, means for moving the irradiated surface to a first direction relative to the first beam and the second beam, and means for moving the irradiated surface to a second direction relative to the first beam and the second beam.

The present invention also provides a laser irradiation apparatus comprising a laser oscillator 1 outputting a wavelength not longer than that of visible light, means for processing a first beam emitted from the laser oscillator 1 into a long beam on an irradiated surface, a laser oscillator 2 outputting a fundamental wave, means for irradiating a second beam emitted from the laser oscillator 2 to a region irradiated with the long beam so as to overlap with the long beam in such a way that energy density of the second beam is increased in opposite ends of the long beam and it is decreased in a center thereof, means for moving the irradiated surface to a first direction relative to the first beam and the second beam, and means for moving the irradiated surface to a second direction relative to the first beam and the second beam.

The present invention also provides a laser irradiation apparatus comprising a laser oscillator 1 outputting a wavelength not longer than that of visible light, means for processing a first beam emitted from the laser oscillator 1 into a long beam on an irradiated surface, a laser oscillator 2 outputting a fundamental wave, means for irradiating a second beam emitted from the laser oscillator 2 to a region irradiated with the long beam so as to overlap with the long beam in such a way that a width of the second beam is broadened in opposite ends of the long beam and it is narrowed in a center thereof, means for moving the irradiated surface to a first direction relative to the first beam and the second beam, and means for moving the irradiated surface to a second direction relative to the first beam and the second beam.

In the above constitution of the present invention, the first direction and the second direction are orthogonalized each other.

In the above constitution of the present invention, the laser oscillator 1 and the laser oscillator 2 are a CW gas laser, a CW solid laser, or a CW metal laser. As the gas laser, an Ar laser, a Kr laser, a $CO_2$ laser, and the like are given. As the solid laser, a YAG laser, a $YVO_4$ laser, a YLF laser, a $YAlO_3$ laser, a $Y_2O_3$ laser, a ruby laser, an alexandrite laser, a Ti: sapphire laser, and the like are given. As the metal laser, a helium cadmium laser, a copper vapor laser, and a gold vapor laser are given.

In addition, in the above constitution of the present invention, the first beam is converted into a harmonic by a nonlinear optical element. As a crystal used for the nonlinear optical element, crystals such as LBO, BBO, KDP, KTP, KB5, and CLBO are superior in terms of conversion efficiency. With the nonlinear optical element put in a resonator of the laser oscillator, it is possible to increase conversion efficiency considerably.

In the above constitution of the present invention, it is preferable that the first beam is emitted with an oscillation mode of $TEM_{00}$ because it becomes possible to improve energy uniformity of the obtained long beam.

When the annealing is performed to a semiconductor film formed over a substrate transparent to a laser beam, in order to realize uniform irradiation of the laser beam, it is desirable that an incidence angle $\phi$ of the laser beam satisfies an inequality of $\phi \geq \arctan(W/2d)$. In the inequality, it is defined that an incidence plane is perpendicular to the irradiated surface and is including a longer side or a shorter side of the laser beam assuming that a shape of the laser beam is rectangular. Moreover, in the inequality, "W" is the length of the longer side or the shorter side included in the incidence plane and "d" is the thickness of the substrate transparent to the laser beam, which is placed at the irradiated surface. In the case of using a plurality of laser beams, the inequality needs to be satisfied with respect to each of the plurality of laser beams. In addition, it is defined that a track of the laser beam projected to the incidence plane has an incidence angle $\phi$ when the track is not on the incidence plane. When the laser beam is made incident at an angle $\phi$, it is possible to perform uniform irradiation of the laser beam without interference of reflected light from a surface of the substrate with reflected light from a rear surface of the substrate. The theory above is considered assuming that a refractive index of the substrate is 1. In fact, the substrate has a refractive index of 1.5 approximately, and a larger value than the angle calculated in accordance with the above theory is obtained when the value around 1.5 is taken into account. However, since the laser beam on the irradiated surface has energy attenuated at opposite sides in the longitudinal direction thereof, the interference has a small influence on opposite sides and the value calculated in accordance with the inequality is enough to obtain the effect of attenuating the interference.

As the substrate, a glass substrate, a quartz substrate, a silicon substrate, a plastic substrate, a metal substrate, a stainless substrate, a flexible substrate, and the like can be used. As the glass substrate, a substrate made of glass such as barium borosilicate glass or aluminum borosilicate glass can be given. The flexible substrate means a membranous substrate made of PET, PES, PEN, acryl, or the like, and weight saving is anticipated when the flexible substrate is used to manufacture a semiconductor device. It is desirable to form a barrier layer such as an aluminum film (for example, AlON, AlN, or AlO), a carbon film (for example, DLC (diamond-like carbon)), or SiN in a single-layer structure or a multi-layer structure over a surface of the flexible substrate or over the surface and a rear surface thereof since the property such as durability is enhanced. The inequality with respect to $\phi$ is inapplicable to a substrate not transparent to the laser beam because the thickness of the substrate "d" becomes a meaningless value at all in this case.

The present invention provides a laser irradiation method comprising the steps of processing a first beam having a wavelength not longer than that of visible light into a long beam on an irradiated surface, moving the irradiated surface to a first direction relative to the long beam while irradiating a second beam having a fundamental wave with energy distribution thereof homogenized in the irradiated surface so as to overlap with the long beam.

The present invention also provides a laser irradiation method comprising the steps of processing a first beam having a wavelength not longer than that of visible light into a long beam on an irradiated surface, and moving the irradiated surface to a first direction relative to the long beam while irradiating a second beam having a fundamental wave to the irradiated surface so as to overlap with the long beam, wherein energy of the second beam is decreased in a region where energy of the first beam is high and the energy of the second beam is increased in a region where the energy of the first beam is low.

The present invention also provides a laser irradiation method comprising the steps of processing a first beam having a wavelength not longer than that of visible light into a long beam on an irradiated surface, and moving the irradiated surface to a first direction relative to the long beam while irradiating a second beam having a fundamental wave to the irradiated surface so as to overlap with the long beam, wherein a width of the second beam is narrowed in a region where energy of the first beam is high and the width of the second beam is broadened in a region where the energy of the first beam is low.

The present invention also provides a laser irradiation method comprising the steps of irradiating a first beam having a wavelength range in which an absorption coefficient to an irradiated surface is $5 \times 10^3$/cm or more simultaneously with a second beam having a wavelength range in which an absorption coefficient to the irradiated surface is $5 \times 10^2$/cm or less and an absorption coefficient to a melted state of the irradiated surface is $5 \times 10^3$/cm or more in such a way that the first beam and the second beam are overlapped on the irradiated surface, and moving the irradiated surface to a first direction relative to the first beam and the second beam.

The present invention also provides a laser irradiation method comprising the steps of irradiating a first beam melting an irradiated surface simultaneously with a second beam in which an absorption coefficient $\alpha$ to a melted state of the irradiated surface and an absorption coefficient $\beta$ to a solid state of the irradiated surface satisfy an inequality of $\alpha > 10\beta$ in such a way that the first beam and the second beam are overlapped on the irradiated surface, and moving the irradiated surface to a first direction relative to the first beam and the second beam.

In the above constitution of the present invention, the first beam or the second beam is emitted from a CW gas laser, a CW solid laser, or a CW metal laser. As the gas laser, an Ar laser, a Kr laser, a $CO_2$ laser, and the like are given. As the solid laser, a YAG laser, a $YVO_4$ laser, a YLF laser, a $YAlO_3$ laser, a $Y_2O_3$ laser, a ruby laser, an alexandrite laser, a Ti:sapphire laser, and the like are given. As the metal laser, a helium cadmium laser, a copper vapor laser, and a gold vapor laser are given.

In the above constitution of the present invention, the first beam is converted into a harmonic by a nonlinear optical element. As a crystal used for the nonlinear optical element, crystals such as LBO, BBO, KDP, KTP, KB5, and CLBO are superior in terms of conversion efficiency. With the nonlinear optical element put in a resonator of the laser oscillator, it is possible to increase conversion efficiency considerably.

In the above constitution of the present invention, it is preferable that the laser beams are emitted with an oscillation mode of $TEM_{00}$ because it becomes possible to improve energy uniformity of the obtained long beam.

When the annealing is performed to a semiconductor film formed over a substrate transparent to a laser beam, in order to realize uniform irradiation of the laser beam, it is desirable that an incidence angle $\phi$ of the laser beam satisfies an inequality of $\phi \geq \arctan(W/2d)$. In the inequality, it is defined that an incidence plane is perpendicular to the irradiated surface and is including a longer side or a shorter side of the laser beam assuming that a shape of the laser beam is rectangular. Moreover, in the inequality, "W" is the length of the longer side or the shorter side included in the incidence plane and "d" is the thickness of the substrate transparent to the laser beam, which is placed at the irradiated surface. In the case of using a plurality of laser beams, the inequality needs to be satisfied with respect to each of the plurality of laser beams. In addition, it is defined that a track of the laser beam projected to the incidence plane has an incidence angle $\phi$ when the track is not on the incidence plane. When the laser beam is made incident at an angle $\phi$, it is possible to perform uniform irradiation of the laser beam without interference of reflected light from a surface of the substrate with reflected light from a rear surface of the substrate. The theory above is considered assuming that a refractive index of the substrate is 1. In fact, the substrate has a refractive index of 1.5 approximately, and a larger value than the angle calculated in accordance with the above theory is obtained when the value around 1.5 is taken into account. However, since the laser beam on the irradiated surface has energy attenuated at opposite sides in the longitudinal direction thereof, the interference has a small influence on opposite sides and the value calculated in accordance with the inequality is enough to obtain the effect of attenuating the interference.

As the substrate, a glass substrate, a quartz substrate, a silicon substrate, a plastic substrate, a metal substrate, a stainless substrate, a flexible substrate, and the like can be used. The inequality with respect to $\phi$ is inapplicable to a substrate not transparent to the laser beam because the thickness of the substrate "d" becomes a meaningless value at all in this case.

In the present invention, the fundamental wave having a wavelength of approximately 1 μm is irradiated supplementarily to the semiconductor film, which is the irradiated surface, simultaneously with the harmonic emitted from the CW laser. In addition, the fundamental wave is irradiated with a comparatively large amount of energy to the region of the semiconductor film where the harmonic is irradiated with a comparatively small amount of energy. The fundamental wave is irradiated with a comparatively small amount of energy to the region of the semiconductor film where the harmonic is irradiated with a comparatively large amount of energy. The present invention provides a laser irradiation method, a laser irradiation apparatus, and a method for manufacturing a semiconductor device, that make it possible to form the long crystal grain region on the semiconductor film while preventing the formation of the inferior crystalline region by means of the method describe above.

FIG. 1(b) is a drawing to explain the content of the present invention. A semiconductor film is irradiated with an elliptical beam spot 106. The beam spot 106 has a wavelength band in the region absorbed sufficiently in the semiconductor film and the energy density distribution of the beam spot 106 in cross section A is shown with a reference numeral 111. In the figure, energy density B is a threshold value at which the long crystal grain region is formed, and energy density C is a threshold value at which the semiconductor film melts.

In the present invention, the beam spot 107 having the fundamental wave is irradiated supplementarily so as to overlap with the beam spot 106. Although the fundamental wave having a wavelength of approximately 1 μm is not absorbed in the normal semiconductor film, it is absorbed sufficiently in the semiconductor film melted by the harmonic. Therefore, the fundamental wave is absorbed only in the region where the beam spot 106 is irradiated and where the energy density exceeds the threshold value C at which the semiconductor film melts. In other words, the energy distribution absorbed in the semiconductor film can be made discontinuous as shown with a continuous line in FIG. 1(b). Therefore, it is also possible to give the semiconductor film only the energy for forming the long crystal grain region without giving it the energy for forming the inferior crystalline region (the energy between the threshold values B and C in FIG. 1(b)) at all.

The energy density distribution absorbed in the semiconductor film when it is irradiated with the beam spots 106 and 107 is shown with a continuous line 112. It is noted that although the absorption coefficient of the fundamental wave is $5 \times 10^2$/cm or less, the absorption coefficient not less than $5 \times 10^3$/cm is necessary in order to process the normal semiconductor film by giving the energy. Therefore, when the absorption coefficient of the fundamental wave changes at least 10 times by melting the semiconductor film, advantageous effect expected by the present invention can be obtained in the process with the present invention applied.

In the irradiation track formed by the beam spots 106 and 107 on the semiconductor film, there are formed states of crystals that can be broadly classified into two types. Regions 108 and 110 are the inferior crystalline regions, and a region 109 is the long crystal grain region. The widths of the regions 108 and 109 are expressed with $X_{2D}$ and $X_{1D}$ respectively. The proportion of the inferior crystalline region is much smaller and that of the long crystal grain region is larger in the irradiation track shown in FIG. 1(b) than those in the irradiation track formed by irradiating only the elliptical beam spot as shown in FIG. 1(a).

In the irradiation track of FIG. 1(a), a region 102 is the inferior crystalline region and a region 103 is the long crystal grain region. The widths of the regions 102 and 103 are expressed with $X_{2S}$ and $X_{1S}$ respectively, and they are in the relation of inequalities of $X_{2S} \gg X_{2D}$ and $X_{1D} > X_{1S}$. In addition, in FIG. 1(b), the beams are scanned in such a way that the harmonic is overlapped with the fundamental wave having the shape in which the width thereof in opposite ends in the longitudinal direction of the beam spot of the harmonic is broad and the width thereof in the center is narrow. The beam spot having the width that is broader in the opposite ends than in the center in the scanning direction is employed as the beam spot 107 of the fundamental wave. When the beam spot 107 is scanned on the semiconductor film, it is possible to keep giving the irradiation energy by the fundamental wave longer to the region irradiated with the end portion of the beam spot of the harmonic than to the region irradiated with the center portion thereof. This makes it possible to homogenize the energy distribution of the laser given to the semiconductor film in the direction of the width of the long crystal grain region. This has an advantageous effect that the electric characteristic of the semiconductor film can be uniformed. The beam spot 107 is shaped by a light-blocking film such as a metal film arranged above the semiconductor film. It is desirable to make the distance between the light-blocking film and the surface of the semiconductor film as short as possible in order to prevent the effect of diffraction light. In addition, the beam spot of the fundamental wave may be shaped not only by the above method but also by the other method. A diffractive optical element or the like may be employed in the structure to irradiate the semiconductor film with the desired beam spot.

As above, in the present invention, the shape of the beam spot of the fundamental wave or the energy distribution thereof is changed to irradiate the semiconductor film so that the fundamental wave is irradiated with a comparatively large amount of energy to the region irradiated by the harmonic with a comparatively small amount of energy.

The above method makes it possible to form a long crystal grain region having more uniform electrical characteristic in the semiconductor film while suppressing the formation of the inferior crystalline region. It is noted that the shape of the beam spot used to irradiate the semiconductor film is not limited to that shown in FIG. 1(b) in the present invention. The beam emitted from the laser of the fundamental wave may be processed so as to have a shape shown in FIGS. 2(a), (b), or (c) and the beam spot having such a shape may be also used. In addition, a plurality of the beams of the harmonics may be chained to form a long beam and the beam spot of the fundamental wave may be overlapped with the long beam. Alternatively, a plurality of the beams of the fundamental waves may be used. Moreover, a plurality of fundamental waves and a plurality of the harmonics may be also used. In addition, after the energy density of the beam spot of the fundamental wave is changed into a shape shown in FIG. 3(a) or (b), the fundamental wave may be irradiated with a comparatively large amount of energy to the region irradiated by the harmonic with a comparatively small amount of energy. Alternatively, even though the fundamental wave is shaped so as to have the uniform energy density distribution as shown in FIG. 3(c), an advantageous effect of the present invention can be obtained.

The present invention provides a method for manufacturing a semiconductor device comprising the steps of forming a non-single crystal semiconductor film over a substrate, irradiating a first beam having a wavelength range in which an absorption coefficient to the non-single crystal semiconductor film is $5 \times 10^3$/cm or more simultaneously with a second beam having a wavelength range in which an absorption coefficient to the non-single crystal semiconductor film is $5 \times 10^2$/cm or less and an absorption coefficient to a melted state of the non-single crystal semiconductor film is $5 \times 10^3$/cm or more in such a way that the first beam and the second beam are overlapped on the irradiated surface, and moving the irradiated surface to a first direction relative to the first beam and the second beam.

The present invention also provides a method for manufacturing a semiconductor device comprising the steps of forming a non-single crystal semiconductor film over a substrate, irradiating a first beam melting the non-single crystal semiconductor film simultaneously with a second beam in which an absorption coefficient $\alpha$ to a melted state of the non-single crystal semiconductor film and an absorption coefficient $\beta$ to a solid state of the non-single crystal semiconductor film satisfy an inequality of $\alpha > 10\beta$ in such a way that the first beam and the second beam are overlapped on the irradiated surface, and moving the non-single crystal semiconductor film to a first direction relative to the first beam and the second beam.

The present invention provides a method for manufacturing a semiconductor device comprising the steps of forming a non-single crystal semiconductor film over a substrate, processing a first beam emitted from a laser oscillator 1 outputting a wavelength not longer than that of visible light into a long beam on an irradiated surface assuming that the non-single crystal semiconductor film is the irradiated surface, irradiating a second beam emitted from a laser oscillator 2 outputting a fundamental wave with energy distribution thereof homogenized in a region irradiated with the first beam on the irradiated surface so as to overlap with the first beam, forming a long crystal grain region and an inferior crystalline region in opposite ends of the long crystal grain region in the non-single crystal semiconductor film while moving the irradiated surface to a first direction relative to the first beam and the second beam, and moving the irradiated surface to a second direction relative to the first beam and the second beam.

The present invention also provides a method for manufacturing a semiconductor device comprising the steps of forming a non-single crystal semiconductor film over a substrate, processing a first beam emitted from a laser oscillator 1 outputting a wavelength not longer than that of visible light into a long beam on an irradiated surface assuming that the non-single crystal semiconductor film is the irradiated surface, irradiating a second beam emitted from a laser oscillator 2 outputting a fundamental wave so as to overlap with the first beam on the irradiated surface in such a way that energy of the second beam is decreased in a region where energy of the first beam is high and that the energy of the second beam is increased in a region where the energy of the first beam is low, forming a long crystal grain region and an inferior crystalline region in opposite ends of the long crystal grain region in the non-single crystal semiconductor film while moving the irradiated surface to a first direction relative to the first beam and the second beam, and moving the irradiated surface to a second direction relative to the first beam and the second beam.

The present invention also provides a method for manufacturing a semiconductor device comprising the steps of forming a non-single crystal semiconductor film over a substrate, processing a first beam emitted from a laser oscillator 1 outputting a wavelength not longer than that of visible light into a long beam on an irradiated surface assuming that the non-single crystal semiconductor film is the irradiated surface, irradiating a second beam emitted from a laser oscillator 2 outputting a fundamental wave so as to overlap with the first beam on the irradiated surface in such a way that a width of the second beam is narrowed in a region where energy of the first beam is high and that the width of the second beam is broadened in a region where the energy of the first beam is low, forming a long crystal grain region and a region in which a crystal grain similar to a crystal formed in opposite ends of the long crystal grain region in the non-single crystal semiconductor film while moving the irradiated surface to a first direction relative to the first beam and the second beam, and moving the irradiated surface to a second direction relative to the first beam and the second beam.

In the above constitution of the present invention, when the width of the long crystal grain region is assumed to be $X_1$ and the width of the inferior crystalline region is assumed to be $X_2$, $X_1$ and $X_2$ satisfy an inequality of $X_2/(2X_2+X_1)<0.1$. It is noted that the crystal grain usually has a diameter of 1 μm or less in the inferior crystalline region.

In the above constitution of the present invention, the first beam or the second beam is emitted from a CW gas laser, a CW solid laser, or a CW metal laser. As the gas laser, an Ar laser, a Kr laser, a $CO_2$ laser, and the like are given. As the solid laser, a YAG laser, a $YVO_4$ laser, a YLF laser, a $YAlO_3$ laser, a $Y_2O_3$ laser, a ruby laser, an alexandrite laser, a Ti: sapphire laser, and the like are given. As the metal laser, a helium cadmium laser, a copper vapor laser, and a gold vapor laser are given.

In the above constitution of the present invention, the first beam is converted into a harmonic by a nonlinear optical element. As a crystal used for the nonlinear optical element, crystals such as LBO, BBO, KDP, KTP, KB5, and CLBO are superior in terms of conversion efficiency. With the nonlinear optical element put in a resonator of the laser oscillator, it is possible to increase conversion efficiency considerably.

In the above constitution of the present invention, it is preferable that the laser beams are emitted with an oscillation mode of $TEM_{00}$ because it becomes possible to improve energy uniformity of the obtained long beam.

When the annealing is performed to the semiconductor film formed over a substrate transparent to the laser beam, in order to realize uniform irradiation of the laser beam, it is desirable that an incidence angle φ of the laser beam satisfies an inequality of $φ≧arctan(W/2d)$. In the inequality, it is defined that an incidence plane is perpendicular to the irradiated surface and is including a longer side or a shorter side of the laser beam assuming that a shape of the laser beam is rectangular. Moreover, in the inequality, "W" is the length of the longer side or the shorter side included in the incidence plane and "d" is the thickness of the substrate transparent to the laser beam, which is placed at the irradiated surface. In the case of using a plurality of laser beams, the inequality needs to be satisfied with respect to each of the plurality of laser beams. It is defined that a track of the laser beam projected to the incidence plane has an incidence angle φ when the track is not on the incidence plane. When the laser beam is made incident at an angle φ, it is possible to perform uniform irradiation of the laser beam without interference of reflected light from a surface of the substrate with reflected light from a rear surface of the substrate. The theory above is considered assuming that a refractive index of the substrate is 1. In fact, the substrate has a refractive index of approximately 1.5, and a larger value than the angle calculated in accordance with the above theory is obtained when the value around 1.5 is taken into account. However, since the laser beam on the irradiated surface has energy attenuated at opposite sides in the longitudinal direction thereof, the interference has a small influence on opposite sides and the value calculated in accordance with the inequality is enough to obtain the effect of attenuating the interference.

In addition, as the substrate, a glass substrate, a quartz substrate, a silicon substrate, a plastic substrate, a metal substrate, a stainless substrate, a flexible substrate, and the like can be used. The inequality with respect to φ is inapplicable to a substrate not transparent to the laser beam because the thickness of the substrate "d" becomes a meaningless value at all in this case.

The present invention provides a laser irradiation apparatus comprising a laser oscillator 1 outputting a wavelength not longer than that of visible light, means for processing a first beam emitted from the laser oscillator 1 into a long beam on an irradiated surface, a laser oscillator 2 outputting a fundamental wave, means for irradiating a second beam emitted from the laser oscillator 2 with energy distribution thereof homogenized in a region irradiated with the long beam, means for moving the irradiated surface to a first direction relative to the first beam and the second beam, and means for moving the irradiated surface to a second direction relative to the first beam and the second beam.

The present invention also provides a laser irradiation apparatus comprising a laser oscillator 1 outputting a wavelength not longer than that of visible light, means for processing a first beam emitted from the laser oscillator 1 into a long beam on an irradiated surface, a laser oscillator 2 outputting a fundamental wave, means for irradiating a second beam emitted from the laser oscillator 2 to a region irradiated with the long beam so as to overlap with the long beam in such a way that energy density of the second beam is increased in opposite ends of the long beam and it is decreased in a center thereof, means for moving the irradiated surface to a first direction relative to the first beam and the second beam, and means for moving the irradiated surface to a second direction relative to the first beam and the second beam.

The present invention also provides a laser irradiation apparatus comprising a laser oscillator 1 outputting a wavelength not longer than that of visible light, means for processing a first beam emitted from the laser oscillator 1 into a long beam on an irradiated surface, a laser oscillator 2 outputting a fundamental wave, means for irradiating a second beam emitted from the laser oscillator 2 to a region irradiated with the long beam so as to overlap with the long beam in such a way that a width of the second beam is broadened in opposite ends of the long beam and it is narrowed in a center thereof, means for moving the irradiated surface to a first direction relative to the first beam and the second beam, and means for moving the irradiated surface to a second direction relative to the first beam and the second beam.

In the above constitution of the present invention, the first direction and the second direction are orthogonalized each other.

In the above constitution of the present invention, the laser oscillator 1 and the laser oscillator 2 are a CW gas laser, a CW solid laser, or a CW metal laser. As the gas laser, an Ar laser, a Kr laser, a $CO_2$ laser, and the like are given. As the solid laser, a YAG laser, a $YVO_4$ laser, a YLF laser, a $YAlO_3$ laser, a $Y_2O_3$ laser, a ruby laser, an alexandrite laser, a Ti: sapphire laser, and the like are given. As the metal laser, a helium cadmium laser, a copper vapor laser, and a gold vapor laser are given.

In addition, in the above constitution of the present invention, the first beam is converted into a harmonic by a nonlinear optical element. As a crystal used for the nonlinear optical element, crystals such as LBO, BBO, KDP, KTP, KB5, and CLBO are superior in terms of conversion efficiency. With the nonlinear optical element put in a resonator of the laser oscillator, it is possible to increase conversion efficiency considerably.

In the above constitution of the present invention, it is preferable that the first beam is emitted with an oscillation mode of $TEM_{00}$ because it becomes possible to improve energy uniformity of the obtained long beam.

When the annealing is performed to a semiconductor film formed over a substrate transparent to a laser beam, in order to realize uniform irradiation of the laser beam, it is desirable that an incidence angle $\phi$ of the laser beam satisfies an inequality of $\phi \geq \arctan(W/2d)$. In the inequality, it is defined that an incidence plane is perpendicular to the irradiated surface and is including a longer side or a shorter side of the laser beam assuming that a shape of the laser beam is rectangular. Moreover, in the inequality, "W" is the length of the longer side or the shorter side included in the incidence plane and "d" is the thickness of the substrate transparent to the laser beam, which is placed at the irradiated surface. In the case of using a plurality of laser beams, the inequality needs to be satisfied with respect to each of the plurality of laser beams. In addition, it is defined that a track of the laser beam projected to the incidence plane has an incidence angle $\phi$ when the track is not on the incidence plane. When the laser beam is made incident at an angle $\phi$, it is possible to perform uniform irradiation of the laser beam without interference of reflected light from a surface of the substrate with reflected light from a rear surface of the substrate. The theory above is considered assuming that a refractive index of the substrate is 1. In fact, the substrate has a refractive index of 1.5 approximately, and a larger value than the angle calculated in accordance with the above theory is obtained when the value around 1.5 is taken into account. However, since the laser beam on the irradiated surface has energy attenuated at opposite sides in the longitudinal direction thereof, the interference has a small influence on opposite sides and the value calculated in accordance with the inequality is enough to obtain the effect of attenuating the interference.

As the substrate, a glass substrate, a quartz substrate, a silicon substrate, a plastic substrate, a metal substrate, a stainless substrate, a flexible substrate, and the like can be used. As the glass substrate, a substrate made of glass such as barium borosilicate glass or aluminum borosilicate glass can be given. The flexible substrate means a membranous substrate made of PET, PES, PEN, acryl, or the like, and weight saving is anticipated when the flexible substrate is used to manufacture a semiconductor device. It is desirable to form a barrier layer such as an aluminum film (for example, AlON, AlN, or AlO), a carbon film (for example, DLC (diamond-like carbon)), or SiN in a single-layer structure or a multi-layer structure over a surface of the flexible substrate or over the surface and a rear surface thereof since the property such as durability is enhanced. The inequality with respect to $\phi$ is inapplicable to a substrate not transparent to the laser beam because the thickness of the substrate "d" becomes a meaningless value at all in this case.

The present invention provides a laser irradiation method comprising the steps of processing a first beam having a wavelength not longer than that of visible light into a long beam on an irradiated surface, moving the irradiated surface to a first direction relative to the long beam while irradiating a second beam having a fundamental wave with energy distribution thereof homogenized in the irradiated surface so as to overlap with the long beam.

The present invention also provides a laser irradiation method comprising the steps of processing a first beam having a wavelength not longer than that of visible light into a long beam on an irradiated surface, and moving the irradiated surface to a first direction relative to the long beam while irradiating a second beam having a fundamental wave to the irradiated surface so as to overlap with the long beam, wherein energy of the second beam is decreased in a region where energy of the first beam is high and the energy of the second beam is increased in a region where the energy of the first beam is low.

The present invention also provides a laser irradiation method comprising the steps of processing a first beam having a wavelength not longer than that of visible light into a long beam on an irradiated surface, and moving the irradiated surface to a first direction relative to the long beam while irradiating a second beam having a fundamental wave to the irradiated surface so as to overlap with the long beam, wherein a width of the second beam is narrowed in a region where energy of the first beam is high and the width of the second beam is broadened in a region where the energy of the first beam is low.

The present invention also provides a laser irradiation method comprising the steps of irradiating a first beam having a wavelength range in which an absorption coefficient to an irradiated surface is $5 \times 10^3$/cm or more simultaneously with a second beam having a wavelength range in which an absorption coefficient to the irradiated surface is $5 \times 10^2$/cm or less and an absorption coefficient to a melted state of the irradiated surface is $5\times10^3$/cm or more in such a way that the first beam and the second beam are overlapped on the irradiated surface, and moving the irradiated surface to a first direction relative to the first beam and the second beam.

The present invention also provides a laser irradiation method comprising the steps of irradiating a first beam melting an irradiated surface simultaneously with a second beam in which an absorption coefficient α to a melted state of the irradiated surface and an absorption coefficient β to a solid state of the irradiated surface satisfy an inequality of α>10β in such a way that the first beam and the second beam are overlapped on the irradiated surface, and moving the irradiated surface to a first direction relative to the first beam and the second beam.

In the above constitution of the present invention, the first beam or the second beam is emitted from a CW gas laser, a CW solid laser, or a CW metal laser. As the gas laser, an Ar laser, a Kr laser, a $CO_2$ laser, and the like are given. As the solid laser, a YAG laser, a $YVO_4$ laser, a YLF laser, a $YAlO_3$ laser, a $Y_2O_3$ laser, a ruby laser, an alexandrite laser, a Ti:sapphire laser, and the like are given. As the metal laser, a helium cadmium laser, a copper vapor laser, and a gold vapor laser are given.

In the above constitution of the present invention, the first beam is converted into a harmonic by a nonlinear optical element. As a crystal used for the nonlinear optical element, crystals such as LBO, BBO, KDP, KTP, KB5, and CLBO are superior in terms of conversion efficiency. With the nonlinear optical element put in a resonator of the laser oscillator, it is possible to increase conversion efficiency considerably.

In the above constitution of the present invention, it is preferable that the laser beams are emitted with an oscillation mode of $TEM_{00}$ because it becomes possible to improve energy uniformity of the obtained long beam.

When the annealing is performed to a semiconductor film formed over a substrate transparent to a laser beam, in order to realize uniform irradiation of the laser beam, it is desirable that an incidence angle φ of the laser beam satisfies an inequality of φ≧arctan (W/2d). In the inequality, it is defined that an incidence plane is perpendicular to the irradiated surface and is including a longer side or a shorter side of the laser beam assuming that a shape of the laser beam is rectangular. Moreover, in the inequality, "W" is the length of the longer side or the shorter side included in the incidence plane and "d" is the thickness of the substrate transparent to the laser beam, which is placed at the irradiated surface. In the case of using a plurality of laser beams, the inequality needs to be satisfied with respect to each of the plurality of laser beams. In addition, it is defined that a track of the laser beam projected to the incidence plane has an incidence angle φ when the track is not on the incidence plane. When the laser beam is made incident at an angle φ, it is possible to perform uniform irradiation of the laser beam without interference of reflected light from a surface of the substrate with reflected light from a rear surface of the substrate. The theory above is considered assuming that a refractive index of the substrate is 1. In fact, the substrate has a refractive index of 1.5 approximately, and a larger value than the angle calculated in accordance with the above theory is obtained when the value around 1.5 is taken into account. However, since the laser beam on the irradiated surface has energy attenuated at opposite sides in the longitudinal direction thereof, the interference has a small influence on opposite sides and the value calculated in accordance with the inequality is enough to obtain the effect of attenuating the interference.

As the substrate, a glass substrate, a quartz substrate, a silicon substrate, a plastic substrate, a metal substrate, a stainless substrate, a flexible substrate, and the like can be used. The inequality with respect to φ is inapplicable to a substrate not transparent to the laser beam because the thickness of the substrate "d" becomes a meaningless value at all in this case.

Advantageous Effect of the Invention

When the laser annealing is performed by the constitution of the present invention, it becomes possible to make the inferior crystalline region as small as possible and to increase the proportion of the long crystal grain region formed on the semiconductor film. Therefore, it becomes possible to decrease the region in which TFT cannot be arranged and to integrate highly the semiconductor element. In the present invention, the fundamental wave having a wavelength of approximately 1 μm is irradiated supplementarily to the semiconductor film, which is the irradiated surface, simultaneously with the harmonic. Therefore, it is possible to suppress the sudden change in temperature of the semiconductor film and to assist the energy of the harmonic having small output effectively and so on. With these advantages satisfied, it is possible to enhance the operating characteristic and the reliability of the semiconductor device typified by an active matrix liquid crystal display device. Furthermore, it is possible to reduce the cost for manufacturing the semiconductor device. The present embodiment can be freely combined with any one of the embodiment modes 1 to 4 and the embodiment 1.

BRIEF DESCRIPTION OF THE DRAWINGS

In the accompanying drawings:

FIG. 1 are drawings for showing a state of an irradiation track of a beam spot;

FIG. 6 are drawings for explaining the embodiment mode 2;

FIG. 8 is a drawing for showing the state of the laser annealing;

FIG. 10 are drawings for explaining manufacturing steps of the semiconductor device of the present invention;

FIG. 12 are drawings for showing the electronic instruments with the use of the present invention.

BEST MODES FOR CARRYING OUT THE INVENTION

Embodiment Mode 1

Figure 4:
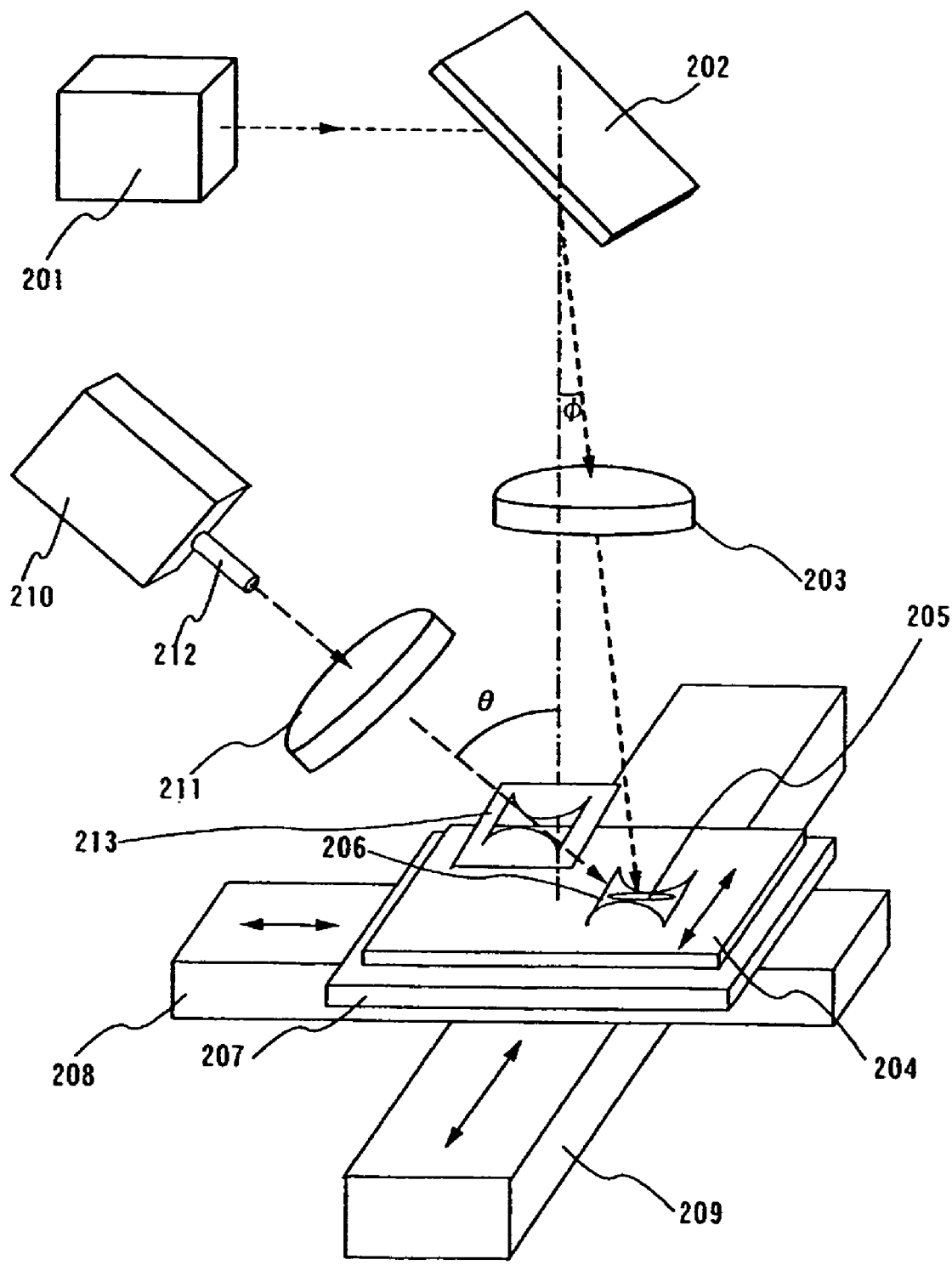
FIG. 4 is a drawing for explaining the embodiment mode 1.

An embodiment mode of the present invention is explained with reference to FIG. 4. The present embodiment mode shows an example of forming a long beam 205 and a long beam 206 to irradiate a surface of a semiconductor film 204.

First, an LD pumped laser oscillator 201 (Nd:YVO$_4$ laser, CW, the second harmonic (532 nm)) having an output of 10 W is prepared. The laser oscillator has an oscillation mode of TEM$_{00}$ and has LBO crystal built in its resonator to convert into the second harmonic. Although it is not in particular necessary to limit to the second harmonic, the second harmonic is superior to the other higher harmonic in terms of energy efficiency. The beam has a diameter of 2.25 mm and a divergence angle of approximately 0.3 mrad. A 45° reflecting mirror 202 is used to change a traveling direction of the laser beam so as to have an angle of φ from the vertical direction. Next, the laser beam is made incident at an angle of φ into a planoconvex lens 203 having a focal length of 20 mm whose plane portion corresponds with the horizontal surface. The angle φ may be changed appropriately and it is set to 20° in this embodiment. The semiconductor film 204 is formed on an irradiated surface and it is made to be parallel to the horizontal surface. The semiconductor film 204 is formed over the surface of a glass substrate. The distance between the semiconductor film 204 and the planoconvex lens 203 is set to approximately 20 mm, which is fine adjusted so that the beam 205 extending long in the direction as parallel as possible to the incidence plane is formed on the semiconductor film 204. The precision of the fine adjustment is set to approximately 50 μm. This forms a long beam 205 having a shape similar to an ellipse and having a size of 500 μm in its major axis and 20 μm in its minor axis.

The substrate with the semiconductor film 204 formed thereover is a glass substrate having a thickness of d and it is fixed on a vacuum suction stage 207 so as not to fall. The vacuum suction stage 207 can operate in XY directions on a surface parallel to the surface of the semiconductor film 204 with the use of a uniaxial robot for X-axis 208 and a uniaxial robot for Y-axis 209. As described above, the inequality not to cause interference is φ≧arctan (W/2d). Therefore, when a substrate has a thickness of 0.7 mm, the inequality of φ≧19.7° is obtained.

Figure 2A:
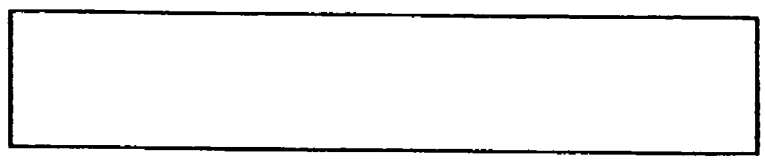
FIG. 2 are drawings for showing an example of the beam spot shape of the fundamental wave in the present invention.
Figure 2B:
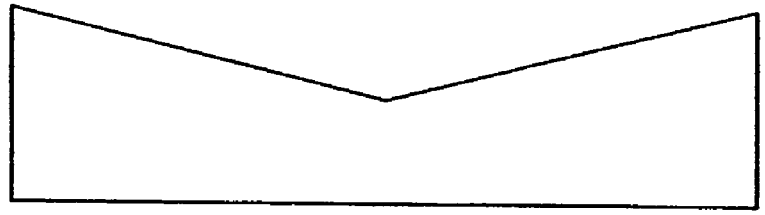
Figure 2C:
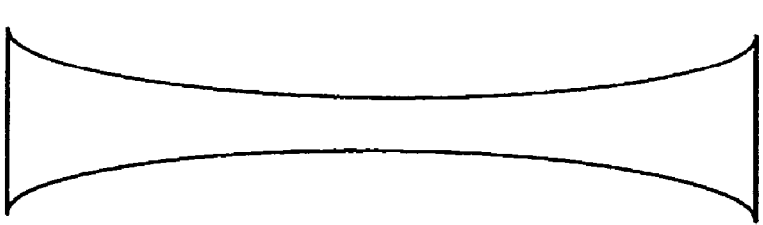
Figure 3A:
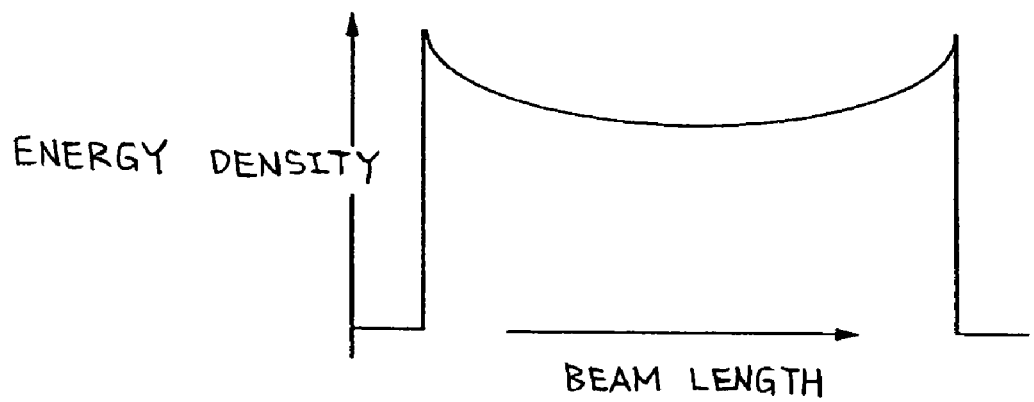
FIG. 3 are drawings for showing an example of energy density of the beam spot of the fundamental wave in the present invention.
Figure 3B:
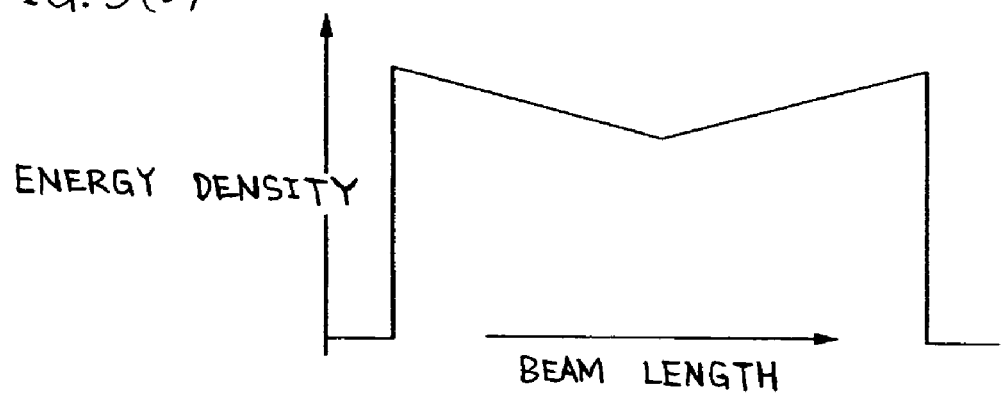
Figure 3C:
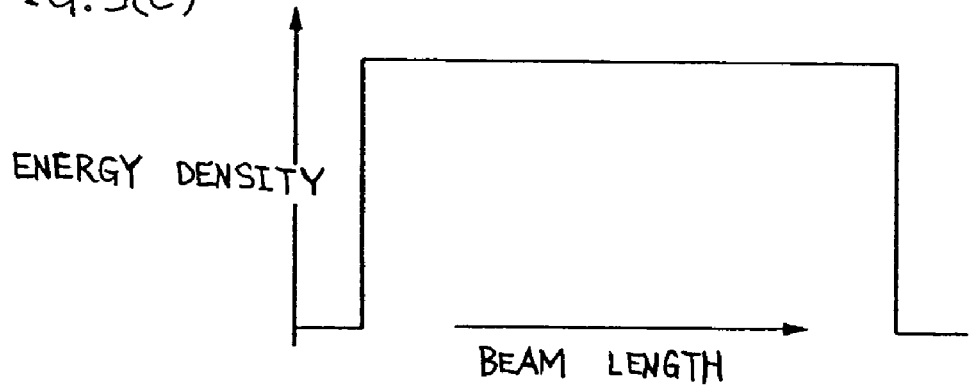

Next, a laser oscillator 210 (Nd:YAG laser, CW, fundamental wave (1.064 μm), TEM$_{00}$) having an output of 350 W is prepared. The fundamental wave oscillated from the laser oscillator transmits through an optical fiber 212 and it is emitted. The optical fiber 212 has a transmission system of SI type and has a core diameter of 0.6 mm. The light emitted from the optical fiber 212 has a numerical aperture (NA) of 0.2. The light emitted from the optical fiber 212 is converged with a planoconvex lens 211. The planoconvex lens 211 has a magnification to converge the beam spot into the same size as the diameter of the optical fiber 212. The beam spot at the focal point, which is 170 mm from the planoconvex lens 211, has a diameter of 0.6 mm. The fundamental wave is made incident into the semiconductor film 204 at an angle θ. The angle θ is set to approximately 55°. The beam spot is shaped by a light-blocking film 213 arranged 100 μm above the surface of the semiconductor film 204. The beam 206 formed so as to have a shape shown in FIG. 2(*c*) by the light-blocking film 213 has a length of 800 μm in its major axis. In addition, the minor axis of the beam 206 is narrow in the center portion, and it is broad in the opposite ends. The widths in the center portion and the opposite end portions are 300 μm and 400 μm respectively, and the widths between them are made to change continuously. The beam 206 is arranged so as to cover the beam 205. Alternatively a kaleidoscope or the like may be employed to form a rectangular beam having uniform energy distribution. In addition, a filter having spatial distribution of transmittance may be used to decrease the energy density in the center of the beam 206.

The annealing with the use of the fundamental wave having a wavelength of approximately 1 μm is not effective because it is not absorbed in the normal semiconductor film that much. With the second harmonic used simultaneously, however, the fundamental wave is absorbed sufficiently in the semiconductor film melted by the harmonic and thereby the annealing efficiency of the semiconductor film improves. In other words, the fundamental wave can be employed in the present step by taking advantage of increasing of the absorption coefficient due to liquefaction of the semiconductor film. The advantageous effects are to suppress sudden change in temperature of the semiconductor film 204 and to assist energy of the laser beam of the second harmonic having small output and so on. Particularly when the fundamental wave has a large divergence in the direction of the minor axis of the long beam 205 of the second harmonic, it is possible to change the temperature slowly. Unlike the harmonic, the fundamental wave does not need the nonlinear optical element for converting the wavelength, and therefore it is possible to obtain a laser beam having an extremely high output, for example having an energy 100 times or more than that of the harmonic. The reason why the energy is thus different is that the non-linear optical element is very weak against the laser. In addition, the non-linear optical element to generate the harmonic is easy to change in quality, and thereby the non-linear optical element has disadvantages that the maintenance-free state, which is one of advantages of the solid laser, cannot be kept long and so on. Therefore, it is very meaningful to assist the harmonic with the use of the fundamental wave according to the present invention.

Next, an example of a method for manufacturing a semiconductor film is shown. The semiconductor film is formed over a glass substrate that is transparent to the visible light. Specifically, silicon oxynitride having a thickness of 200 nm is formed over one side of the glass substrate having a thickness of 0.7 mm, and an amorphous silicon film having a thickness of 66 nm is formed thereon by a plasma-CVD method. Moreover, in order to increase the resistance of the semiconductor film against the laser, the thermal annealing is performed to the semiconductor film at a temperature of 500° C. for an hour. Instead of the thermal annealing, the semiconductor film may be crystallized with the metal element as described in the background art. In any case, the optimum condition for irradiating the laser beam to the semiconductor film is almost the same.

Next, an example of a laser irradiation to the semiconductor film 204 is shown. Although the laser oscillator 201 has an output of approximately 10 W at a maximum, the energy density is enough because the size of the long beam 205 is comparatively small. Therefore, the irradiation is performed with the energy lowered to approximately 9 W. In addition, the output of the laser oscillator 210 is set to 350 W, and the beam 206 is formed so as to cover the long beam 205. The laser annealing can be performed in such a way that the substrate with the semiconductor film 204 formed thereover is scanned to the direction of the minor axis of the long beam 205 using the uniaxial robot for Y-axis 209.

FIG. 5 shows the state of the semiconductor film after performing the laser annealing in fact by means of the above method. FIG. 5(*a*) is a photograph taken by a transmission bright field microscope, and FIG. 5(*b*) is a photograph taken by a reflection dark field microscope. The long crystal grain region extending long in the scanning direction can be formed in a region having a width of 235 μm in the direction of the major axis of the long beam 205. The inferior crystalline region is formed 15 μm in width in the opposite ends of the long crystal grain region. At the time of the scanning, the fundamental wave is irradiated to the semiconductor film 204 first, and then the second harmonic is irradiated, and after that the fundamental wave is irradiated again at last. Since the fundamental wave is absorbed in melted silicon, a sudden change in temperature of the semiconductor film 204 can be suppressed.

Figure 5A:
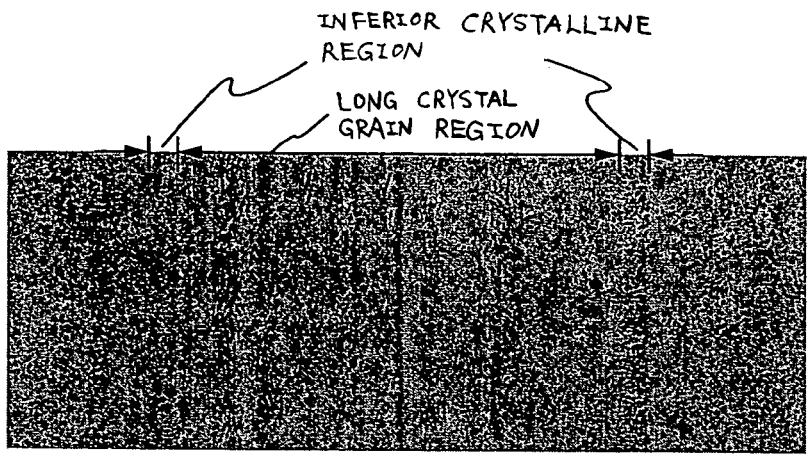
FIG. 5 are drawings for showing the laser annealing of the semiconductor film.
Figure 5B:
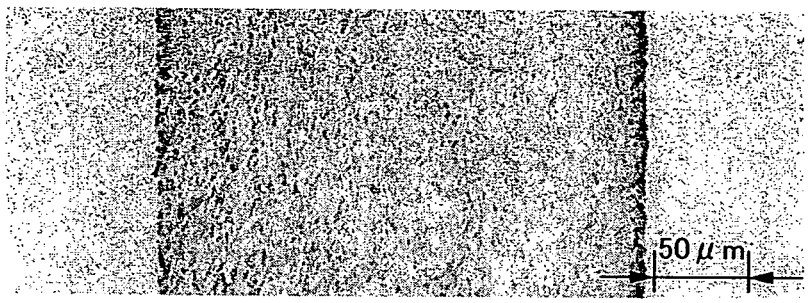
Figure 5C:
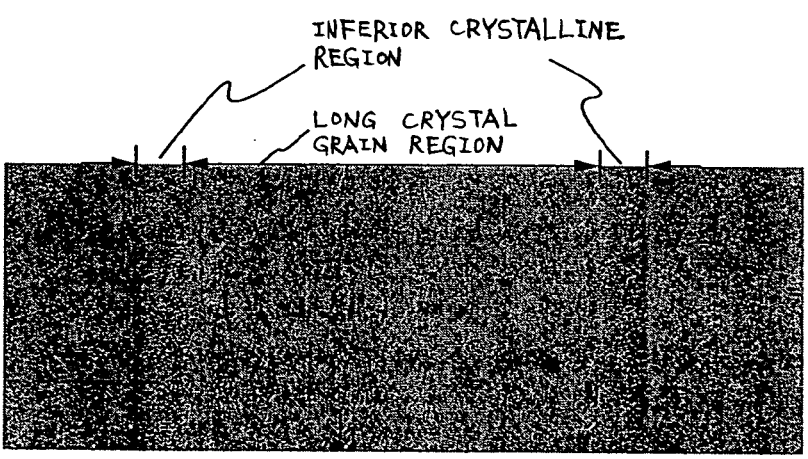
Figure 5D:
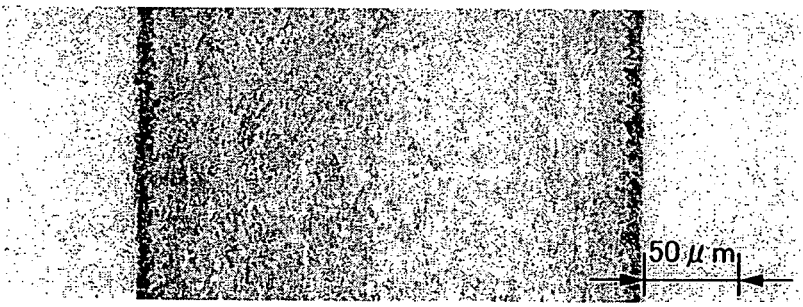

FIGS. 5(c) and 5(d) show the state of the semiconductor film after performing the laser annealing under the condition in which the output of the laser oscillator 201 is set to 10 W and the fundamental wave emitted from the laser oscillator 210 is not irradiated. FIG. 5(c) is a photograph taken by the transmission bright field microscope, and FIG. 5(d) is a photograph taken by the reflection dark field microscope. The long crystal grain region extending long in the scanning direction is formed in the region having a width of 220 μm in a direction of the major axis of the long beam 205. And the inferior crystalline region is formed 25 μm in width in opposite ends of the long crystal grain region. Compared with FIGS. 5(a) and 5(b), it is understood that the long crystal grain region is narrowed and the inferior crystalline region is broadened. These results indicate that the method according to the present invention can reduce the proportion of the inferior crystalline region formed in opposite ends of the long crystal grain region. It is noted that the opposite ends of the irradiation track in FIGS. 5(b) and 5(d) have a portion whose surface is very rough (shown with black color in the figures). It is understood that, however, when the method of the present invention is employed, the laser annealing can be performed while decreasing the portion having a very rough surface.

It is noted that the laser beam of the harmonic is incident at an angle of 20° or more in this embodiment mode. This can prevent the interference so that more uniform laser irradiation can be performed. The scanning speed is appropriate in the range of several tens cm/s to several hundreds cm/s, and it is set to 50 cm/s here.

FIG. 8 shows an irradiation method to form a long crystal grain region in the whole surface of the semiconductor film. In order to make it easier to understand, reference numerals in FIG. 8 are the same as those in FIG. 4. The substrate with the semiconductor film formed thereover is fixed to the vacuum suction stage 207 and then the laser oscillator 201 and the laser oscillator 210 are oscillated. The outputs are set to 9 W and 300 W respectively. Initially, the uniaxial robot for Y-axis 209 is used to scan the surface of the semiconductor film in one straight line at a scanning speed of 50 cm/s. The straight line corresponds to a portion of "A1" in FIG. 8. In FIG. 8, after the laser beams are irradiated to a portion of outward "Am" (m is a positive integer) using the Y-axis robot 209, the X-axis robot 208 is used to slide the long beams in the direction of the major axis thereof by the width of the long crystal grain region and the inferior crystalline region, and then the laser beams are irradiated to a portion of homeward "Bm". Alternatively the long beams may be slid by the width of only the long crystal grain region to perform the laser irradiation. By repeating such round of operation, it is possible to keep the high proportion of the long crystal grain region all over the semiconductor film. It is noted that the semiconductor film in the long crystal grain region has a quite high characteristic. In particular, in the case of manufacturing a semiconductor device such as TFT, the semiconductor device can be expected to show a considerably high electrical mobility. Conversely, it is unnecessary to form the long crystal grain region in a portion of the semiconductor film not requiring such a high characteristic. Therefore, the laser beam may not be irradiated to such a portion, or the irradiation may be performed so as not to form the long crystal grain region. In order to anneal the semiconductor film effectively not to form the long crystal grain region, the scanning speed may be increased, for example. According to the experiment of the present inventor, when only the long beam 205 was scanned at a speed of approximately 2 m/s, the amorphous silicon film could be crystallized without forming the long crystal grain region, and what is called a poly-silicon film was formed. It goes without saying that the above condition depends on the semiconductor film, which is the irradiated object, the energy distribution of the laser beam, and so on.

Embodiment Mode 2

This embodiment mode explains an example in which several long beams obtained by shaping the second harmonics are combined to form a longer beam, and moreover, it is assisted with the energy of the fundamental wave with reference to FIG. 6.

First, four LD pumped laser oscillators each of which has an output of 10 W (Nd:YVO$_4$ laser, CW, the second harmonic (532 nm)) are prepared (not shown in the figure). Each laser oscillator has an oscillation mode of TEM$_{00}$ and the laser beam emitted from each laser oscillator is converted into the second harmonic through LBO crystal built in its resonator. The beam has a diameter of 2.25 mm and has a divergence angle of approximately 0.3 mrad. Several reflecting mirrors are used in order to change traveling directions of the respective laser beams so as to have an angle β to the vertical direction, and the laser beams are made incident into an irradiated surface from four directions so as to be combined into nearly one at the irradiated surface. The four directions are made to correspond to optical axes A, B, C, and D respectively. The optical axes A and B (also the optical axes C and D) are positioned plane-symmetrically to a plane A that is perpendicular to the irradiated surface, and an angle made by the optical axes A and B (also an angle made by the optical axes C and D) is set to 20°. In addition, the optical axes A and C (also the optical axes B and D) are positioned plane-symmetrically to a plane B that is perpendicular to the plane A and the irradiated surface, and an angle made by a plane C including the optical axes A and B, and a plane D including the optical axes C and D is set to 50°.

Then, planoconvex cylindrical lenses 401a, 401b, 401c, and 401d each of which has a focal length of 150 mm are arranged so that the optical axes A, B, C, and D are incident thereinto at an angle of 0° respectively. On this occasion, converging directions of the planoconvex cylindrical lenses are the directions included in the plane C or the plane D. The distance between the irradiated surface and each of the planoconvex cylindrical lenses 401a to 401d is adjusted between 110 mm and 120 mm when measured along the optical axes respectively.

Further, planoconvex cylindrical lenses 402a and 402b each of which has a focal length of 20 mm are arranged so that their generating lines are included in the planes C and D respectively. The generating line is defined as the generating line located at a curved portion of the cylindrical lens that is the farthest from the plane portion of the cylindrical lens. The planoconvex cylindrical lens 402a is arranged so that the plane portion thereof is orthogonalized with the plane C, and the planoconvex cylindrical lens 402b is arranged so that the plane portion thereof is orthogonalized with the plane D. The distance between the irradiated surface and each of the planoconvex cylindrical lenses 402a and 402b is adjusted so as to be approximately 18 mm when measured along the optical axes respectively.

With the arrangement described above, four long beams each having a size of 400 μm in the major axis and 20 μm in the minor axis are formed on the irradiated surface. When nothing is done, the four long beams are combined into one perfectly on the irradiated surface without forming the longer beam. When the positions of the respective lenses are fine adjusted, however, the arrangement of the four long beams can be changed as shown in FIG. 6(b). That is to say, the major axes of the four long beams 405a, 405b, 405c, and 405d are arranged in a straight line and shifted each other in the direction of their major axes to form the longer beam out of the long beams. In this way, a long crystal grain region having a width of 1.5 mm can be obtained.

Next, a CW LD-pumped YAG laser (fundamental wave) having an output of 2000 W is used to form a beam 405e on the irradiated surface through an optical element 404 such as a diffractive optical element. The beam 405e has a length of 2 mm in its major axis. In addition, the beam 405e has the shape in which the minor axis thereof is narrow in the center portion and it is broad in the opposite end portions. The widths of the beam in the center portion and in the opposite end portions are 0.8 mm and 1 mm respectively and the widths between them are made to change continuously. On this occasion the beam 405e is formed so as to cover four long beams. Alternatively a kaleidoscope may be used to form a rectangular beam having uniform energy distribution. It is noted that the laser beam is reflected somewhat on a surface of a semiconductor film. Therefore, the laser beam must not be made incident into the irradiated surface vertically because the fundamental wave must not return to the oscillator.

The long beam formed as described above may be used to crystallize the whole surface of the semiconductor film, for example with the use of the uniaxial robot for X-axis 208 and the uniaxial robot for Y-axis 209 shown in Embodiment Mode 1. The semiconductor film may be formed, for example in accordance with the method described in Embodiment Mode 1. This embodiment mode obtains advantages that the longer beam can shorten processing time and that the energy distribution is homogenized in the direction of its major axis because the long beams with Gaussian energy distribution are overlapped each other contiguously, which makes it possible to suppress the variation in temperature comparatively.

Embodiment Mode 3

Figure 7:
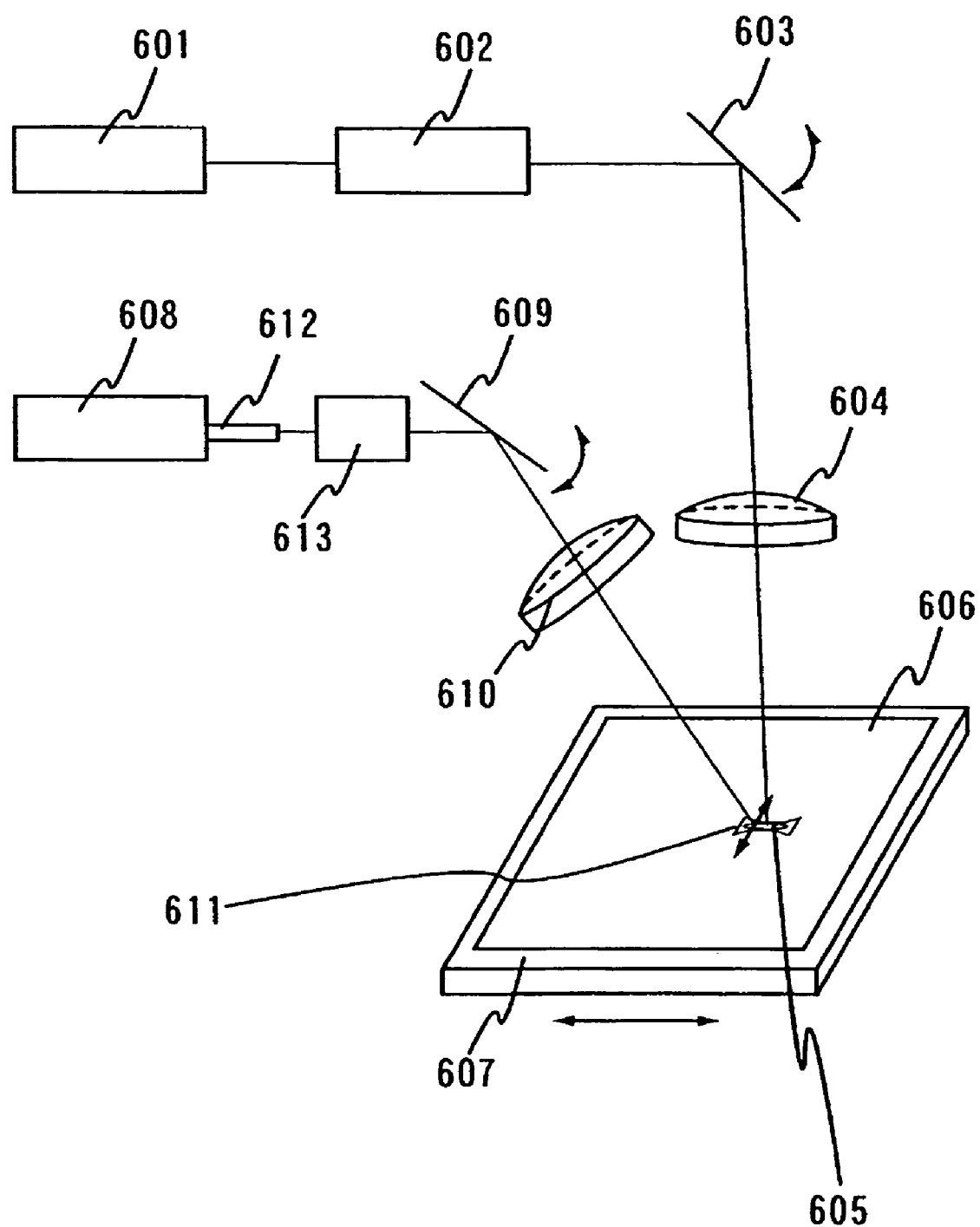
FIG. 7 is a drawing for explaining the embodiment mode 3.

This embodiment mode explains an example in which the long beam obtained by shaping the second harmonic is irradiated with the use of deflecting means such as a galvanometer mirror, and in addition, the laser beam of the fundamental wave is irradiated with the use of deflecting means such as a galvanometer mirror in order to assist the energy with reference to FIG. 7.

First, an LD pumped laser oscillator 601 having an output of 10 W (Nd:YVO$_4$ laser, CW, the second harmonic (532 nm)) is prepared. The laser oscillator has an oscillation mode of TEM$_{00}$ and the laser beam is converted into the second harmonic by LBO crystal built in its resonator. The beam has a diameter of 2.25 mm and has a divergence angle of approximately 0.3 mrad. Since this beam is circular, it is made incident into an optical system 602 for shaping it into oblong. A beam expander including two cylindrical lenses may be used as the shaping means for example, and the beam may be extended only in one direction so as to have an elliptical shape. Alternatively, a general beam expander may be combined with the above beam expander in order to control the divergence angle. Next, the laser beam shaped into elliptical is deflected by a galvanometer mirror 603. The deflected laser beam reaches a plane formed with a semiconductor film 606 through an fθ lens 604. The elliptical laser beam is converged on the plane through the fθ lens. This forms a long beam 605 having a size of 20 μm in the minor axis and 400 μm in the major axis on the plane. The long beam 605 is scanned on the plane by changing the angle of the galvanometer mirror 603. The fθ lens 604 can prevent the long beam 605 from changing in shape due to the angle of the galvanometer mirror. The incidence angle of the laser beam to the semiconductor film 606 is set to 20°. This can prevent the interference between the reflected light from the surface of the semiconductor film 606 and the reflected light from the rear surface of the substrate with the semiconductor film 606 formed thereover.

In order to irradiate the fundamental wave to the semiconductor film 606 in accordance with the long beam 605 formed by the second harmonic, an LD pumped YAG laser 608 having an output of 300 W (Nd:YAG laser, CW, fundamental wave (1.064 μm), TEM$_{00}$, the divergence angle is approximately 3 mrad) is prepared. The fundamental wave oscillated from the laser oscillator transmits through an optical fiber 612 and it is emitted. The transmission system of the optical fiber is SI type, and the optical fiber has a core diameter of 0.6 mm. The light emitted from the optical fiber has an NA of 0.2. The light emitted from the optical fiber is processed into a rectangular beam having uniform energy distribution and collimated through an optical system 613. It is a kaleidoscope that processes the emitted light. The collimated laser beam is deflected to the direction of the semiconductor film 606 by a galvanometer mirror 609. The deflected laser beam reaches a plane formed with the semiconductor film 606 through an fθ lens 610. The fθ lens converges the laser beam on the plane so as to form a laser beam 611 having a size of 1 mm in the major axis on the plane. The minor axis of the beam 611 is narrow in the center portion thereof, and it is broad in the opposite end portions. The widths of the beam in the center portion and in the opposite end portions are 450 μm and 600 μm respectively and the widths between them are made to change continuously. The beam 611 is arranged so as to cover the beam 605. Alternatively the beam may be shaped so as to be rectangular (for example, approximately 1 mm×0.5 mm).

The change of the angle of the galvanometer mirror 609 scans the beam 611 on the plane. The galvanometer mirror 609 is controlled so as to operate in synchronization with the galvanometer mirror 603 and to scan the beam 611 in accordance with the position of the long beam 605 of the second harmonic on the plane. The fθ lens 610 suppresses the change of the shape of the beam 611 due to the angle of the galvanometer mirror. The incidence angle of the laser beam to the semiconductor film 606 is set to approximately 55°. This can prevent the interference on the semiconductor film 606 between the reflected light of the laser beam from the surface of the semiconductor film 606 and the reflected light of the laser beam from the rear surface of the substrate with the semiconductor film 606 formed over the substrate.

In this embodiment mode, the galvanometer mirrors 603 and 609 are consisted of one mirror respectively and they are scanned only in one axis. With this scanning, however, the whole surface of the two-dimensional plane cannot be scanned. Therefore, the substrate is mounted on the uniaxial stage 607 so that the substrate moves in right-and-left direction on paper in FIG. 7 to anneal the whole surface of the substrate. The scanning speed of the long beam 605 is set in the range of 100 to 2000 mm/s, and it is preferably set to approximately 500 mm/s.

In order to perform the laser annealing to the whole surface of the semiconductor film 606, for example, after operating the galvanometer mirrors 603 and 609 in a half cycle, the uniaxial stage 607 is moved by the width of the long crystal grain region, and then the galvanometer mirror 603 is operated in a half cycle again repeatedly. In this embodiment mode, the width of the long crystal grain region is approximately 235 μm and the uniaxial stage 607 is forwarded sequentially by its width.

It is noted that although this embodiment mode explained the structure in which the laser beam of the fundamental wave is scanned with the galvanometer mirror, the galvanometer mirror may not be employed. The laser beam of the fundamental wave may be scanned in the same position as the irradiation position of the laser beam of the second harmonic by moving the fiber and the optical system relative to the substrate in the structure.

Embodiment Mode 4

This embodiment mode explains what is called a system-on-panel equipped with a pixel portion in which a pixel including a display element is arranged in matrix, a driver circuit for controlling the pixel portion, a protective circuit, and an electrical circuit such as a memory, all of which are formed on the same substrate with reference to FIG. 9.

Figure 9A:
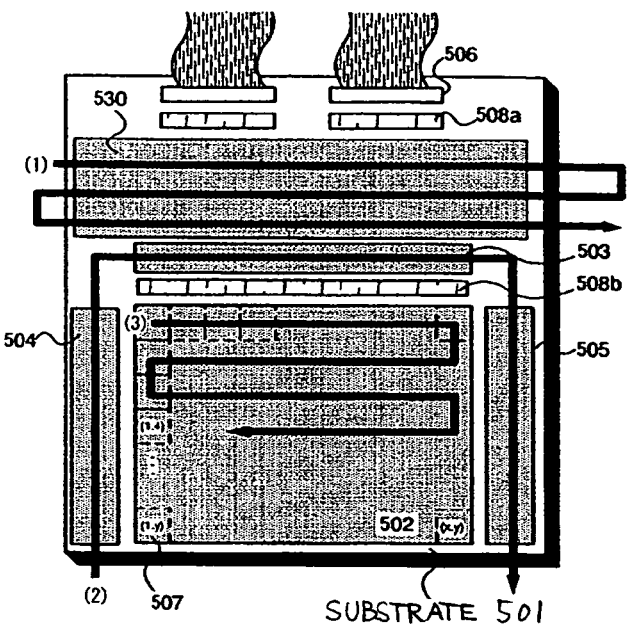
FIG. 9 are drawings for explaining the embodiment mode 4.
Figure 9B:
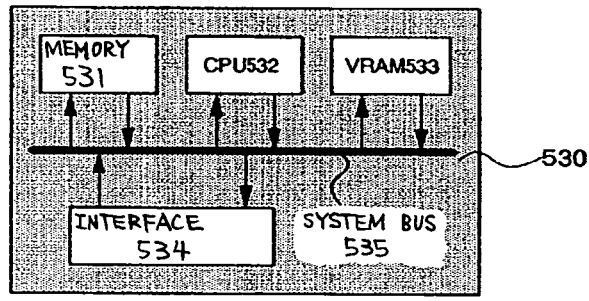

In FIG. 9(B), the panel has a pixel portion 502 in which a plurality of pixels 507 are arranged in matrix, a signal line driver circuit 503, and scanning line driver circuits 504 and 505 for controlling the pixel portion 502, all of which are arranged on a substrate 501. Furthermore, the panel is connected to the external circuit such as IC through an FPC 506. Protective circuits 508a and 508b are provided with the purpose of the countermeasure against the noise of the input signal and the electrostatic. That is to say, they are provided between the driver circuit into which each signal such as a start pulse, a clock, a clock back, and a video signal is input from the external circuit, and the external circuit for supplying these signals therefrom. For this reason, the protective circuit 508a is arranged between each of the driver circuits 503 to 505 into which the start pulse, the clock, and the clock back are input, and the FPC 506. Moreover, the protective circuit 508b is arranged between the signal line driver circuit 503 having the video line through which the video signal is input arranged therein and the pixel portion 502. A large amount of current might flow through the protective circuits 508a and 508b or a large amount of voltage might be applied to them instantaneously. Therefore, it is preferable to constitute them by the amorphous semiconductor which is superior in the resistivity. It is noted that the arrangement of the protective circuits is not limited to the above. For example, the protective circuits may be arranged between the scanning line driver circuits 504 and 505, and the pixel portion 502, or may be arranged in the pixel 507. When the protective circuit is arranged in the pixel 507, however, it is necessary to consider the parameter such as the pixel pitch, the channel length and the channel width of the transistor, and the width of the region irradiated with the laser light in order to make the amorphous semiconductor and the crystalline semiconductor separately in the pixel 507.

The display element is arranged in each of the plurality of the pixels 507 arranged in the pixel portion 502. For example, the display element such as a light-emitting element and a liquid crystal element is arranged. Either the amorphous semiconductor or the crystalline semiconductor is preferable for the transistor for controlling such a display element and it is selected according to the application or the corresponding display element. For example, when the liquid crystal element is used as the display element for manufacturing a large panel having a size of approximately 20 inches, it is preferable to use the inexpensive amorphous semiconductor because even the transistor having the amorphous semiconductor as its active layer does not have any effects due to its speed of response. In addition, when the self light-emitting element is employed as the display element, since the speed of response is rapid, it is preferable to use the transistor having the crystalline semiconductor which is superior in the speed of response as its active layer.

A shift resistor and a buffer are provided in the signal line driver circuit 503. When a point sequential scanning is performed, a sampling circuit is provided. When a line sequential scanning is performed, a latch circuit is provided. In addition, the shift resistor and the buffer are provided in the scanning line driver circuits 504 and 505. Since the element provided in such a driver circuit requires a high-speed operation, it is preferable to use the transistor having the crystalline semiconductor as its active layer.

In addition, the panel has an electric circuit 530 including a logic circuit such as a memory provided therein. It is preferable to employ the element using the poly-crystal semiconductor having a large grain and having few crystal defects obtained by the CW laser as the element requiring the high-speed operation in the electrical circuit 530, which will be hereinafter described in detail. In addition, since the element using the crystalline semiconductor obtained by the CW laser is superior in its mobility and its speed of response, the high-speed operation is possible and the operation frequency of the element can be more enhanced than before. Moreover, the variation of the characteristic can be reduced, and therefore it is possible to obtain high reliability. The fundamental wave having a wavelength of approximately 1 μm is irradiated supplementarily to the semiconductor film, which is the irradiated surface, simultaneously with the harmonic emitted from the CW laser. The fundamental wave is irradiated with a comparatively large amount of energy to the region in the semiconductor film irradiated by the harmonic with a comparatively small amount of energy. The fundamental wave is irradiated with a comparatively small amount of energy to the region in the semiconductor film irradiated by the harmonic with a comparatively large amount of energy. Particularly in the present invention, since the inferior crystalline region caused by employing the CW laser is very small, the semiconductor element can be integrated in the high density. The CW laser is irradiated by means of any one of the embodiment modes 1 to 3.

Initially, after determining the layout in the substrate 501 and determining which to apply in each circuit, the amorphous semiconductor or the crystalline semiconductor, the laser light is set so as to be irradiated only to the position where the circuit including the crystalline semiconductor is arranged. More specifically, CW laser light converged into linear is scanned in one direction so as to be irradiated only to the position where the circuit including the crystalline semiconductor is arranged in the amorphous semiconductor (irradiated object) formed over the whole surface of the substrate 501 so that the crystal grows continuously in the scanning direction and the crystal grain of a single crystal extending long in the scanning direction is assembled.

In this embodiment mode, as shown with (1) in FIG. 9(A), the laser light is irradiated to the part corresponding to the electrical circuit 530, and then, as shown with (2), the laser light is irradiated to the part corresponding to each driver circuit, and at last, as shown with (3), the laser light is irradiated to the part corresponding to the pixel portion 502. Thus the laser light can be irradiated selectively. By doing so, it is possible to make the amorphous semiconductor and the crystalline semiconductor separately in accordance with the requirement of each circuit easily at the same time.

Next, the structure of the electrical circuit 530 and its simple operation are explained with reference to FIGS. 9(B) to (D).

In FIG. 9(B), the electrical circuit 530 has a memory 531, a CPU 532, a VRAM 533, an interface 534, and a system bus 535, which are formed integrally together with the other circuit such as a pixel on the substrate having an insulating surface. The memory 531 is constituted by a volatile memory such as an SRAM and a DRAM, and saves an image data. In addition, the VRAM 533 is constituted by the volatile memory such as the SRAM and the DRAM. The interface 534 saves a signal input from the external device temporarily, converts format, and so on. The operation thereof is simply explained as follows. The image data and the control signal supplied from the external device such as a keyboard or a ROM communicate between the CPU 532 and the external device through the interface 534 and the system bus 535. The CPU 532 stores the image data in the processing and the control signal of the logical temporarily in the memory 531 and the processed image data is stored in the VRAM 533. The image data stored in the VRAM 533 is supplied to each pixel 507 through the driver circuit.

Figure 9C:
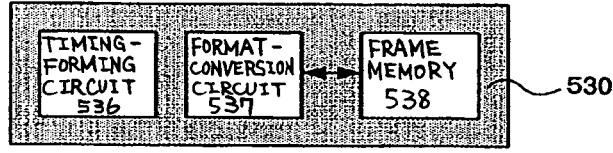

In FIG. 9(C), the electrical circuit 530 has a frame memory 538, a timing-forming circuit 536 and a format-conversion circuit 537, which are formed integrally together with the other circuit such as a pixel over the substrate having an insulating surface. The timing-forming circuit 536 forms a clock, a clock back for determining the operational timing of each driver circuit. The format-conversion circuit 537 uncompresses and decodes the signal that is compressed and encoded, and that is input from the external device through FPC. Moreover, the format-conversion circuit 537 interpolates the image or processes the image such as resizing. The format-converted image data is stored in the frame memory 538 and the stored image data is supplied to each pixel 507 through the driver circuit.

Figure 9D:
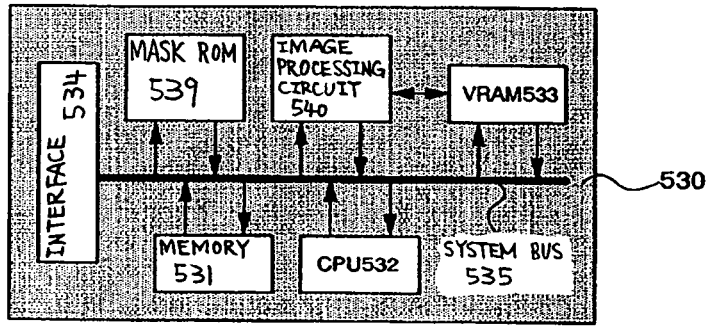

In FIG. 9(D), the electrical circuit 530 has the VRAM 533, a mask ROM 539 an image processing circuit 540, the memory 531, the CPU 532, and the interface 534, which are formed integrally together with the other circuit such as a pixel on the substrate having an insulating surface. The control signal is communicated to the external device such as a keyboard through the interface 534 and the system bus 535. A program data and the image data are stored in the mask ROM 539. The data stored in the mask ROM 539 is processed by the CPU 532 while being read and written as needed between the mask ROM 539 and the memory 531. The image data is processed, for example resizing, by the image processing circuit 540 and it is stored in the VRAM 533. The data stored in the VRAM 533 is supplied to each pixel 507 through the driver circuit.

Each circuit included in the electrical circuit 530 described above is constituted mainly by the semiconductor element. Specifically, a three-terminal element such as a transistor, a two-terminal element such as a diode, a capacitance element, and a resistance element can be given as the semiconductor element. Since high-speed operation is required, the present invention employs a transistor having the crystalline semiconductor formed by the CW laser as its active layer, which has the high mobility. Therefore, the high-speed operation is realized, and when the SRAM is used as the memory 531 and the frame memory 538, a read cycle can be made to 200 ns or less. When the DRAM is used, the read cycle can be made to 1 μs or less. Moreover, the operational frequency of the CPU and the image processing circuit 537 can be made to 5 MHz or more. It is noted that the structure of the electrical circuit 530 is not limited to that described above, and the structure thereof may include one element or a plurality of elements selected from the group consisting of a resistor, a decoder, a counter, a divider circuit, a memory, a CPU, a DSP, and the like.

On the other hand, a large amount of current might flow through the protective circuits 508a and 508b or a large amount of voltage might be applied to them instantaneously. Therefore, it is preferable to constitute them by the amorphous semiconductor which is superior to the resistivity.

In addition, when the transistor having the crystalline semiconductor as its active layer is used, it is possible to achieve a monolithic structure in which various circuits are formed on the insulating surface. Such a panel has fewer peripheral circuits such as an IC to be connected and therefore, the structure becomes simple. This is a big advantage in the case of using the crystalline semiconductor. As this embodiment mode, in the system-on-panel where various circuits are formed over the same substrate as the electrical circuit 530, the miniaturization, the weight-saving, and thinning can be achieved and therefore it is effective to all the electronic instruments to be applied. It is particularly effective to the portable terminal above all.

This embodiment mode can be freely combined with the above embodiment modes. The present invention having the above structure is explained by way of the embodiment hereinafter shown in more detail.

Embodiment 1

The present embodiment explains a manufacturing step for forming an N-channel transistor and a P-channel transistor each of which has a crystalline semiconductor as its active layer, and forming a transistor having the amorphous semiconductor as its active layer over the same substrate with reference to the drawings.

A substrate having an insulating surface is used as a substrate 300 (FIG. 10(A)). The substrate 300 in this embodiment was made of a barium borosilicate glass. Subsequently, the substrate 300 was covered by an element selected from the group consisting of Ta, W, Ti, Mo, Al, Cu, Cr, and Nd, by a chemical compound material or an alloy material including the above element as its main component, by a semiconductor film typified by a poly-crystal silicon with the impurity such as phosphorus doped, or by a publicly known material having conductivity such as AgPdCu alloy. After that, it was patterned to form a conductive layer 301. This conductive layer 301 corresponds to a gate electrode. Subsequently, an insulating film including silicon such as a silicon nitride oxide film or a silicon oxynitride film was formed in a single-layer or in a laminated layer by a publicly known method (plasma-CVD) as the insulating film 302. This insulating film 302 plays a role as both the gate insulating film and the base film.

Next, an amorphous semiconductor 303 was formed in thickness ranging from 25 to 80 nm by a publicly known method (sputtering method, LPCVD method, plasma-CVD, or the like). After that, in the present invention, the laser crystallization method is employed to form the crystalline semiconductor. On this occasion, it is possible to form the amorphous semiconductor and the crystalline semiconductor on the same substrate by irradiating the CW laser light selectively. The CW gas laser or the CW solid laser is used as the laser in the present process. In this embodiment, the second harmonic of a CW $YVO_4$ laser (wavelength 532 nm, 5.5 W) and the fundamental wave of a CW YAG laser (wavelength 1.064 μm, 350 W) are used to scan on the amorphous semiconductor 303 selectively according to the method shown in the embodiment mode, and the amorphous semiconductor 303 and a crystalline semiconductor 304 are formed over the substrate 300. The fundamental wave having a wavelength of approximately 1 μm is irradiated supplementarily to the semiconductor film, which is the irradiated surface, simultaneously with the harmonic emitted from the CW laser. In addition, the fundamental wave is irradiated with a comparatively large amount of energy to the region of the semiconductor film irradiated by the harmonic with a comparatively small amount of energy. The fundamental wave is irradiated with a comparatively small amount of energy to the region of the semiconductor film irradiated by the harmonic with a comparatively large amount of energy. The long crystal grain region thus formed has an extremely higher filling factor than before, and therefore the semiconductor element can be integrated in the high density. This embodiment showed the example in which the amorphous semiconductor 303 is formed. With the present invention, however, it is also possible to form the crystalline semiconductor 304 all over the semiconductor film. By doing this, it becomes possible to form the semiconductor element having a high characteristic in any region on the whole surface of the semiconductor film. Therefore, this is advantageous in manufacturing the CPU and the like requiring high-speed operation.

After that, an N-type amorphous semiconductor doped with phosphorus (P) was formed by supplying mixed gas of silane gas ($SiH_4$) and phosphine gas ($PH_3$) with the use of a publicly known technique such as a CVD method. Subsequently, an amorphous semiconductor layer 306, crystalline semiconductor layers 307 and 308, and N-type semiconductor layers 309 to 311 are formed by patterning the amorphous semiconductor 303, the crystalline semiconductor 304, and the N-type amorphous semiconductor 305 (FIG. 10(B)).

Subsequently, a resist mask 312 was formed and then each of the N-type semiconductor layers 310 and 311 in contact with the crystalline semiconductor layers 307 and 308 were removed by a publicly known method (FIG. 10(C)). More specifically, the N-type semiconductor layers 310 and 311 are removed by an etching method utilizing a selection ratio of the N-type semiconductor layers 310 and 311, and the crystalline semiconductor layers 307 and 308.

Next, a conductive film 3120 is formed of a publicly known material having conductivity so as to cover the N-type semiconductor layer 309 and the crystalline semiconductor layers 310 and 311 (FIG. 10(D)).

After that, N-type semiconductor layers 313 and 314, and conductive layers 315 and 316 are formed with the use of a resist mask (FIG. 10(E)). On this occasion, the amorphous semiconductor layer 306 becomes thin to some extent. After that, an insulating film 317 is formed so as to cover the conductive layers 315 and 316, and the crystalline semiconductor layers 307 and 308. This insulating film 317 plays a role as both the protective film and the gate insulating film.

Figure 11A:
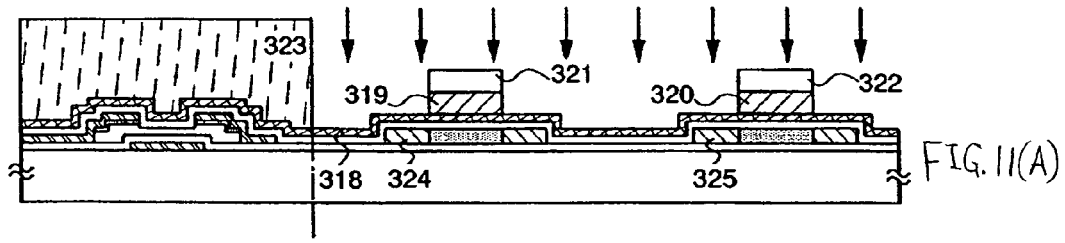
FIG. 11 are drawings for explaining manufacturing steps of the semiconductor device of the present invention.

Subsequently, a first conductive film 318 is formed of a publicly known material having conductivity in thickness ranging from 20 to 100 nm on the insulating film 317 (FIG. 11(A)). Next, a second conductive film having a thickness ranging from 100 to 400 nm and a silicon nitride film having a thickness ranging from 100 to 400 nm are formed in such a way that they are laminated so as to cover the first conductive film 318. Subsequently, the silicon nitride film is patterned first, and then the insulating layers 321 and 322 are formed, and next the second conductive film is patterned to form conductive layers 319 and 320 using the insulating films 321 and 322 as the mask.

Next, a resist mask 323 is formed by a photolithography method, and a doping process is performed. In the present process, the impurity element imparting N-type that belongs to 15th group such as phosphorus and arsenic is added to the semiconductor layers 307 and 308 at a low concentration. In this embodiment, the doping process is performed using phosphorus under a condition in which the dose amount is set to $5.0\times10^{13}$ ions/cm$^2$, and the accelerating voltage is set to 50 keV. On this occasion, the conductive layers 319 and 320, and the insulating layers 321 and 322 become mask against the impurity imparting N-type to form impurity regions 324 and 325 in a self-aligning manner and the impurity element imparting N-type is added in concentration ranging from $1\times10^{18}$ to $1\times10^{20}$ atoms/cm$^3$.

Figure 11B:
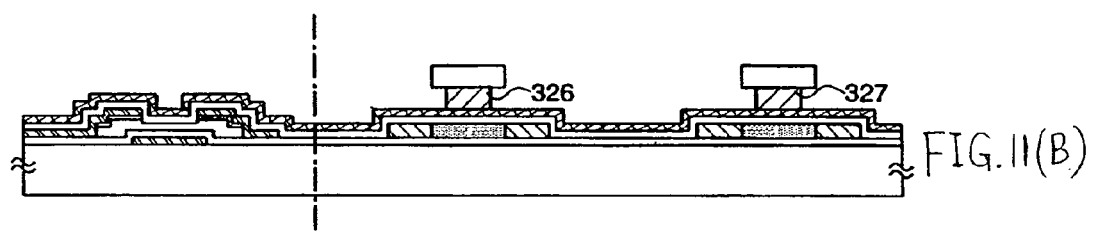

After removing the resist mask 323, anisotropic side etching is performed to roll back the conductive layers 319 and 320 and to form conductive layers 326 and 327 (FIG. 11(B)).

Figure 11C:
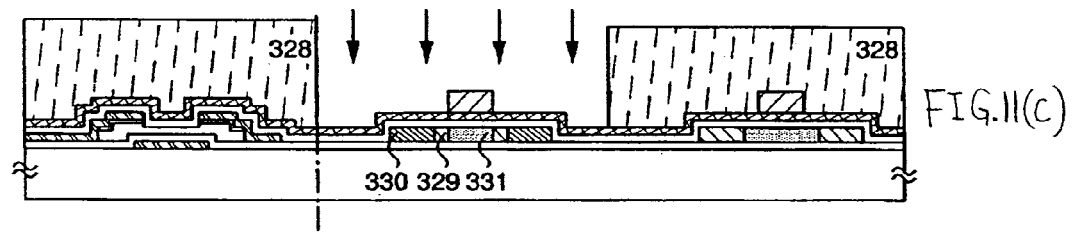

After that, the insulating layers 321 and 322 functioned as the mask were removed by means of etching (FIG. 11(C)). In the present embodiment, they are removed by wet etching using HF system etchant. Subsequently, a resist mask 328 is formed newly, and a doping process is performed at a higher accelerating voltage than that in the above doping process. In this embodiment, the conductive layer 326 is used as the mask against the impurity element under the condition in which the dose amount is set to $3.0\times10^{15}$ ions/cm$^2$ and the accelerating voltage is set to 65 keV. As a result of performing the doping process, the impurity element was added to the impurity region (N− region, LDD region) 329 in concentration ranging from $1\times10^{18}$ to $5\times10^{19}$ atoms/cm$^3$ and the impurity element imparting N-type is added to the impurity region (N+ region) 330 in concentration ranging from $1\times10^{19}$ to $5\times10^{21}$ atoms/cm$^3$. In addition, a channel-forming region 331 is formed.

Figure 11D:
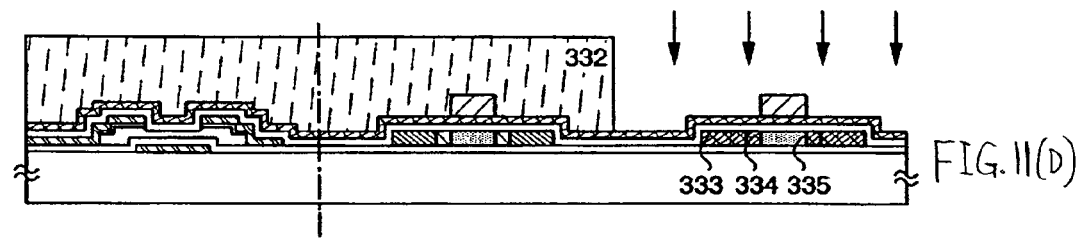

Subsequently, after removing the resist mask 328, a resist mask 332 was formed newly (FIG. 11(D)). After that, a doping process is performed to form an impurity region in which the impurity element imparting a conductivity type opposite to the first conductivity type is added in the semiconductor layer that becomes an active layer of a P-channel TFT. In the present process, the conductive layer 327 is used as the mask against the impurity element and the impurity element imparting P-type is added to form an impurity region (P+ region) 333, an impurity region (P− region) 334, and a channel-forming region 335 in a self-aligning manner. In this embodiment, an ion doping method using diborane ($B_2H_6$) is employed under a condition in which the dose amount is set to $1\times10^{16}$ ions/cm$^2$ and the accelerating voltage is set to 80 keV so that the concentration of the impurity element imparting P-type ranges from $1\times10^{19}$ to $5\times10^{21}$ atoms/cm$^3$. It is noted that the condition and the like in the doping process are not limited to those described above, and the impurity regions may be formed by performing the doping process twice or more.

Figure 11E:
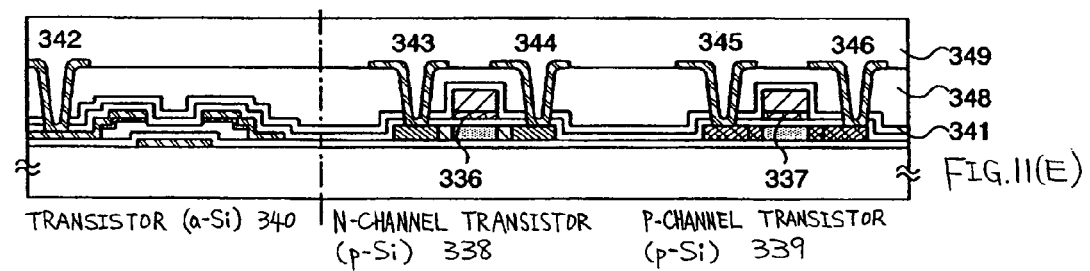

Next, the resist mask 332 is removed and the first conductive film 318 is anisotropically etched to form conductive layers 336 and 337 using the conductive layers 326 and 327 as the mask (FIG. 11(E)). With the above-mentioned processes, an N-channel transistor (p-Si TFT) 338 and a P-channel transistor (p-Si TFT) 339 both of which include the crystalline semiconductor, and a transistor (a-Si TFT) 340 including the amorphous semiconductor could be formed on the same substrate.

Subsequently, the insulating film 341 is formed. This insulating film 341 is formed of an insulating film including silicon in thickness ranging from 100 to 200 nm in a single-layer structure or in a laminated-layer structure. In this embodiment, a silicon oxynitride film having a thickness of 100 nm was formed by the plasma-CVD method.

Subsequently, a heating process (heat treatment) may be performed to recover a crystallinity of the semiconductor layer or to activate the impurity element added in the semiconductor layer. It is preferable that this heating process is performed by the laser annealing method or an RTA method that makes it possible to heat selectively by scanning the heat source so as not to crystallize the amorphous semiconductor due to the heat.

Next, an insulating film 348 is formed on the insulating film 341. As the insulating film 348, there is a silicon oxide film formed by the CVD method, a silicon oxide film applied by an SOG method, an organic insulating film such as polyimide, polyamide, BCB, or an acryl, or a laminated film of an acrylic film and a silicon oxynitride film. In this embodiment, an acryl film having a thickness of 1.6 µm was formed. The film that is easily flattened is preferable as the insulating film 348 because the insulating film 348 has a connotation to ease the convexity and concavity due to TFT formed over the substrate 200 and to flatten them.

Next, the insulating films 317, 341, and 348 were etched to form a contact hole reaching the conductive layer 315, and the impurity regions 330 and 333. Then, after forming the conductive film to be electrically connected with each impurity region using a publicly known material having conductivity in a single-layer structure or in a laminated-layer structure, the conductive film is patterned to form wirings 342 to 346. Subsequently, an insulating film 349 was formed so as to cover the wirings 342 to 346.

The transistor applied for the functional circuit, typified by CPU, preferably has an LDD structure or a GOLD structure and it is preferable to miniature the transistor for speed-up. The N-type transistor 338 and the P-type transistor 339 completed by this embodiment may be applied not only for controlling the display element but also for the functional circuit because it has the LDD structure. In addition, it is essential for the gate insulating film 317 to be thin with the miniaturization. In the process of this embodiment, the doping process is performed in the state that the gate insulating film 317 is covered with the first conductive film 318 and therefore the gate insulating film 317 is protected. Thus it is also effective for miniaturization. In addition, with the CW laser, it is possible to manufacture a transistor using the poly-crystal semiconductor having few crystal defects and having a large crystal grain. Therefore, the mobility and the speed of response are good and it is preferable to use it in the functional circuit even from this prospect.

The present embodiment can be performed in combination with any one of the embodiment modes 1 to 4 freely.

Embodiment 2

As the electronic instrument manufactured by applying the present invention, there are a video camera, a digital camera, a goggles type display (a head mounted display), a navigation system, a sound playback system (a car audio, an audio compo, and the like), a notebook personal computer, a game machine, a personal digital assistance (a mobile computer, a mobile phone, a mobile game machine, an electronic book, or the like), and an image reproduction device equipped with a recording medium (specifically a device for running the recording medium such as Digital Versatile Disc (DVD) or the like which is equipped with a display for displaying the image). FIG. 12 shows specific examples of these electronic instruments.

FIG. 12(A) is a display device including a chassis 3001, a supporting stand 3002, a display portion 3003, a speaker portion 3004, a video input terminal 3005, and the like. The present invention can be applied to manufacture the display portion 3003. Since the light-emitting device is a self light-emitting type, it does not require a backlight. Therefore, the display portion can be made thinner than a liquid crystal display. It is noted that the display device includes all the information display devices for a personal computer, for TV broadcast reception, for advertisement, and the like.

FIG. 12(B) is a digital steel camera including a main body 3101, a display portion 3102, an image receiver 3103, an operation key 3104, an external connection port 3105, a shutter 3106, and the like. The present invention can be applied to manufacture the display portion 3102.

FIG. 12(C) is a notebook personal computer including a main body 3201, a chassis 3202, a display portion 3203, a keyboard 3204, an external connection port 3205, a pointing mouse 3206, and the like. The present invention can be applied to manufacture the display portion 3203.

FIG. 12(D) is a mobile computer including a main body 3301, a display portion 3302, a switch 3303, an operation key 3304, an infrared port 3305, and the like. The present invention can be applied to manufacture the display portion 3302.

FIG. 12(E) is a mobile image playback system equipped with a recording medium (specifically a DVD player) including a main body 3401, a chassis 3402, a display portion A3403, a display portion B3404, a recording medium (DVD or the like) reader 3405, an operation key 3406, a speaker portion 3407, and the like. The display portion A3403 mainly displays the image information, and the display portion B3404 mainly displays textual information. The present invention can be applied to these display portions A, B3403, and 3404. It is noted that the image playback system equipped with the recording medium includes a home-use game machine.

FIG. 12(F) is a goggle-type display (a head mounted display) including a main body 3501, a display portion 3502, and an arm portion 3503. The present invention can be applied to manufacture the display portion 3502.

FIG. 12(G) is a video camera including a main body 3601, a display portion 3602, a chassis 3603, an external connection port 3604, a remote control receiver 3605, an image receiver 3606, a battery 3607, a voice input portion 3608, an operation key 3609, an eyepiece portion 3610, and the like. The present invention can be applied to manufacture the display portion 3602.

FIG. 12(H) is a mobile phone including a main body 3701, a chassis 3702, a display portion, 3703, a voice input portion 3704, a voice output portion 3705, an operation key 3706, an external connection port 3707, an antenna 3708, and the like. The present invention can be applied to manufacture the display portion 3703. It is noted that the consumption electricity of the mobile phone can be decreased by displaying the white text on the black-colored back ground in the display portion 3703.

The invention claimed is:

1. A method for manufacturing a semiconductor device comprising:
    forming a non-single crystal semiconductor film over a substrate,
    shaping a beam into a second beam via a light-blocking film wherein the second beam has a wavelength range in which an absorption coefficient to the non-single crystal semiconductor film is $5\times10^2$/cm or less and an absorption coefficient to a melted state of the non-single crystal semiconductor film is $5\times10^3$/cm or more;
    irradiating a first beam having a wavelength range in which an absorption coefficient to the non-single crystal semiconductor film is $5\times10^3$/cm or more simultaneously with the second beam in such a way that the first beam and the second beam are overlapped on the non-single crystal semiconductor film, and moving the non-single crystal semiconductor film to a first direction relative to the first beam and the second beam.

2. A method for manufacturing a semiconductor device comprising:

forming a non-single crystal semiconductor film over a substrate, shaping a beam into a second beam via a light-blocking film wherein the second beam has an absorption coefficient α to a melted state of the non-single crystal semiconductor film and has an absorption coefficient β to a solid state of the non-single crystal semiconductor film and an inequality of α>10β is satisfied;

irradiating a first beam melting the non-single crystal semiconductor film simultaneously with the second beam in such a way that the first beam and the second beam are overlapped on the non-single crystal semiconductor film, and moving the non-single crystal semiconductor film to a first direction relative to the first beam and the second beam.

3. A method for manufacturing a semiconductor device comprising:

forming a non-single crystal semiconductor film over a substrate, processing a first beam emitted from a laser oscillator 1 outputting a wavelength not longer than that of visible light into a long beam on an irradiated surface assuming that the non-single crystal semiconductor film is the irradiated surface, emitting a beam having a fundamental wave from a laser oscillator 2 outputting the fundamental wave with energy distribution thereof homogenized in a region irradiated with the first beam;

shaping the beam having the fundamental wave into a second beam having the fundamental wave via a light-blocking film;

irradiating the second beam in such a way that the first beam and the second beam are overlapped on the irradiated surface, forming a long crystal grain region and an inferior crystalline region in opposite ends of the long crystal grain region while moving the irradiated surface to a first direction relative to the first beam and the second beam, and moving the irradiated surface to a second direction relative to the first beam and the second beam.

4. A method for manufacturing a semiconductor device comprising:

forming a non-single crystal semiconductor film over a substrate, processing a first beam emitted from a laser oscillator 1 outputting a wavelength not longer than that of visible light into a long beam on an irradiated surface assuming that the non-single crystal semiconductor film is the irradiated surface, emitting a beam having a fundamental wave from a laser oscillator 2 outputting the fundamental wave;

shaping the beam having the fundamental wave into a second beam having the fundamental wave via a light-blocking film;

irradiating the second beam so as to overlap with the first beam in such a way that energy of the second beam is decreased in a region where energy of the first beam is high, and the energy of the second beam is increased in a region where the energy of the first beam is low, forming a long crystal grain region and an inferior crystalline region in opposite ends of the long crystal grain region while moving the irradiated surface to a first direction relative to the first beam and the second beam, and moving the irradiated surface to a second direction relative to the first beam and the second beam.

5. A method for manufacturing a semiconductor device comprising:

forming a non-single crystal semiconductor film over a substrate, processing a first beam emitted from a laser oscillator 1 outputting a wavelength not longer than that of visible light into a long beam on an irradiated surface assuming that the non-single crystal semiconductor film is the irradiated surface, emitting a beam having a fundamental wave from a laser oscillator 2 outputting the fundamental wave;

shaping the beam having the fundamental wave into a second beam having the fundamental wave via a light-blocking film;

irradiating the second beam so as to overlap with the first beam in such a way that a width of the second beam is narrowed in a region where energy of the first beam is high, and the width of the second beam is broadened in a region where the energy of the first beam is low, forming a long crystal grain region and an inferior crystalline region in opposite ends of the long crystal grain region while moving the irradiated surface to a first direction relative to the first beam and the second beam, and moving the irradiated surface to a second direction relative to the first beam and the second beam.

6. A method for manufacturing a semiconductor device according to any one of claims 1 to 5, wherein when a width of the long crystal grain region is assumed to be $X_1$, and a width of the inferior crystalline region in the opposite ends of the second beam is assumed to be $X_2$, $X_1$ and $X_2$ satisfy an inequality of $X_2/(2X_2+X_1)<0.1$.

7. A method for manufacturing a semiconductor device according to any one of claims 1 to 5, wherein the laser oscillator 1 or the laser oscillator 2 is a continuous wave gas laser, a continuous wave solid laser, or a continuous wave metal laser.

8. A method for manufacturing a semiconductor device according to any one of claims 1 to 5, wherein the laser oscillator 1 or the laser oscillator 2 is one selected from the group consisting of an Ar laser, a Kr laser, a $CO_2$ laser, a YAG laser, a $YVO_4$ laser, a YLF laser, a $YAlO_3$ laser, a $Y_2O_3$ laser, a ruby laser, an alexandrite laser, a Ti: Sapphire laser, a helium-cadmium laser, a copper vapor laser, or a gold vapor laser.

9. A method for manufacturing a semiconductor device according to any one of claims 1 to 5, wherein the first direction and the second direction are orthogonalized to each other.

10. A method for manufacturing a semiconductor device according to any one of claims 1 to 5, wherein the irradiated surface is a film formed over a substrate which is transparent to the first beam and which has a thickness of d, wherein an incidence angle φ of the first beam with respect to the irradiated surface satisfies an inequality of $\phi \geq \arctan(W/2d)$ when a major axis or a minor axis of the long beam is assumed to be W.

* * * * *